United States Patent
Zou et al.

(10) Patent No.: US 12,129,971 B2
(45) Date of Patent: Oct. 29, 2024

(54) CRYOSTAT DEVICES FOR MAGNETIC RESONANCE IMAGING AND METHODS FOR MAKING

(71) Applicant: SHANGHAI UNITED IMAGING HEALTHCARE CO., LTD., Shanghai (CN)

(72) Inventors: Lijun Zou, Shanghai (CN); Yan Guo, Shanghai (CN); Xiaogang Yang, Shanghai (CN); Yingping He, Shanghai (CN); Yanqing Cai, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 234 days.

(21) Appl. No.: 17/456,654

(22) Filed: Nov. 29, 2021

(65) Prior Publication Data
US 2022/0082209 A1    Mar. 17, 2022

Related U.S. Application Data

(62) Division of application No. 16/024,765, filed on Jun. 30, 2018, now Pat. No. 11,187,381.

(30) Foreign Application Priority Data

Sep. 29, 2017 (CN) .......................... 201710906373.9
Oct. 31, 2017 (CN) .......................... 201711054371.8
Nov. 24, 2017 (CN) .......................... 201711195403.6

(51) Int. Cl.
*F17C 3/00* (2006.01)
*F17C 3/08* (2006.01)
(Continued)

(52) U.S. Cl.
CPC ................ *F17C 3/085* (2013.01); *F25B 9/14* (2013.01); *G01R 33/3804* (2013.01); *G01R 33/3815* (2013.01)

(58) Field of Classification Search
CPC ....... H01F 6/04; F17C 3/085; G01R 33/3804; F25B 9/14; F25B 9/145
See application file for complete search history.

(56) References Cited

U.S. PATENT DOCUMENTS 5,027,075 A   6/1991   Harding, Jr.
7,498,814 B1  3/2009   Huang et al.
(Continued)

FOREIGN PATENT DOCUMENTS

CN    2279640 Y     4/1998
CN    101024432 A   8/2007
(Continued)

OTHER PUBLICATIONS

First Office Action in Chinese Application No. 201711195403.6 mailed on Sep. 4, 2019, 17 pages.
(Continued)

*Primary Examiner* — Brian M King
(74) *Attorney, Agent, or Firm* — METIS IP LLC

(57) ABSTRACT

The cryostat may include an inner vessel configured to accommodate one or more superconducting coils, an outer vessel encompassing the inner vessel, and a thermal shield configured between the outer vessel and the inner vessel. The thermal shield may include an internal cylinder having a first end and an external cylinder encompassing the internal cylinder, the external cylinder having a second end. The thermal shield may also include a seal head configured between the internal cylinder and the external cylinder, the seal head having a first edge and a second edge. The thermal shield may further include a connecting component includ- (Continued)

ing a plurality of connectors. Each of the plurality of connectors may be configured to connect the first end of the internal cylinder with the first edge of the seal head and/or the second end of the external cylinder with the second edge of the seal head.

20 Claims, 24 Drawing Sheets

(51) Int. Cl.
*F25B 9/14* (2006.01)
*G01R 33/38* (2006.01)
*G01R 33/3815* (2006.01)

(56) References Cited

U.S. PATENT DOCUMENTS

| | | | |
|---|---|---|---|
| 2005/0252219 | A1 | 11/2005 | Van Hasselt |
| 2006/0236709 | A1* | 10/2006 | Steinmeyer ............... H01F 6/04 |
| | | | 165/104.21 |
| 2011/0101982 | A1 | 5/2011 | Huang et al. |
| 2011/0136671 | A1 | 6/2011 | Citver et al. |
| 2011/0160064 | A1 | 6/2011 | Pfleiderer et al. |
| 2012/0108433 | A1 | 5/2012 | Jiang et al. |
| 2016/0103193 | A1 | 4/2016 | Kwon |
| 2016/0202332 | A1 | 7/2016 | Huang et al. |
| 2017/0123025 | A1 | 5/2017 | Celik et al. |
| 2017/0284726 | A1* | 10/2017 | Johnstone .......... G01R 33/3804 |
| 2018/0144852 | A1* | 5/2018 | Ito ............................. F25B 9/14 |
| 2019/0302204 | A1* | 10/2019 | Koeber .............. G01R 33/3804 |
| 2020/0088892 | A1 | 3/2020 | Liu et al. |

FOREIGN PATENT DOCUMENTS

| | | |
|---|---|---|
| CN | 200951449 Y | 9/2007 |
| CN | 101093744 A | 12/2007 |
| CN | 201060416 Y | 5/2008 |
| CN | 102426464 A | 4/2012 |
| CN | 102792396 A | 11/2012 |
| CN | 103901371 A | 7/2014 |
| CN | 104795197 A | 7/2015 |
| CN | 106653280 A | 5/2017 |
| CN | 107035865 A | 8/2017 |
| CN | 106373699 A | 5/2018 |
| CN | 106373699 B | 5/2018 |
| EP | 1744170 A1 | 1/2007 |
| JP | 4821675 B2 | 11/2011 |
| JP | 2014161860 A | 9/2014 |
| WO | 2007135459 A1 | 11/2007 |

OTHER PUBLICATIONS

Second Office Action in Chinese Application No. 201711195403.6 mailed on Apr. 7, 2020, 17 pages.
First Office Action in Chinese Application No. 201711054371.8 mailed on Apr. 11, 2019, 12 pages.

* cited by examiner

CRYOSTAT DEVICES FOR MAGNETIC RESONANCE IMAGING AND METHODS FOR MAKING

CROSS-REFERENCE TO RELATED APPLICATIONS

This application is a division of U.S. application Ser. No. 16/024,765, filed on Jun. 30, 2018, which claims priority to Chinese Patent Application No. 201710906373.9, filed on Sep. 29, 2017, Chinese Application No. 201711054371.8, filed on Oct. 31, 2017, and Chinese Application No. 201711195403.6, filed on Nov. 24, 2017. Each of the above-referenced applications is expressly incorporated herein by reference in its entirety.

TECHNICAL FIELD

This disclosure generally relates to magnetic resonance imaging (MRI) systems, and more particularly, to cryostat devices for MRI systems.

BACKGROUND

Magnetic resonance imaging (MRI) systems are widely used to diagnose and treat medical conditions by exploiting a powerful magnetic field and radio frequency (RF) techniques. In some embodiments, the powerful magnetic field may be generated using superconducting coils under a low working temperature (e.g., approximately 4.2 K). Generally, the superconducting coils may be placed in a cryostat including a cryogen (e.g., liquid helium) configured to keep the superconducting coils under a low working temperature (e.g., approximately 4.2 K). A cryostat may include multiple vessels to reduce heat exchange between the internal and external of the cryostat. For example, the cryostat may include a vacuum vessel, an inner vessel, and a thermal shield. It is desirable to provide cryostats with an improved temperature holding capacity and methods for manufacturing such cryostats.

SUMMARY

According to an aspect of the present disclosure, a cryostat may be provided. The cryostat may include an inner vessel configured to accommodate one or more superconducting coils, an outer vessel encompassing the inner vessel, and a thermal shield configured between the outer vessel and the inner vessel. The thermal shield may include an internal cylinder having a first end and an external cylinder encompassing the internal cylinder. The external cylinder having a second end. The thermal shield may also include a seal head configured between the internal cylinder and the external cylinder, the seal head having a first edge and a second edge. The thermal shield may further include a connecting component including a plurality of connectors. Each of the plurality of connectors may be configured to connect the first end of the internal cylinder with the first edge of the seal head and/or the second end of the external cylinder with the second edge of the seal head.

In some embodiments, the connecting component may be formed by bending a first extension of at least one of the first end or the second end.

In some embodiments, the connecting component may be formed by bending a second extension of at least one of the first edge or the second edge of the seal head.

In some embodiments, at least one of the first extension or the second extension may be configured with a plurality of gaps.

In some embodiments, a width of at least one of the plurality of gaps configured on the first extension may increase in a direction from the first end of the internal cylinder to the first edge of the seal head or from the second end of the external cylinder to the second edge of the seal head, or a width of at least one of the plurality of gaps configured on the second extension may increase in a direction from the first edge to of the seal head the first end of the internal cylinder or from the second edge of the seal head to the second end of the external cylinder.

In some embodiments, the maximum width of each of the plurality of gaps may be in the range from 1 mm to 20 mm.

In some embodiments, the thermal shield may further include a cover layer configured to cover at least one of the plurality of gaps.

In some embodiments, the connecting component may detachably connect the first end of the internal cylinder with the first edge of the seal head and/or connect the second end of the external cylinder with the second edge of the seal head.

In some embodiments, the cryostat may further include a cooling assembly configured to cool the one or more superconducting coils. The cooling assembly may include at least one heat exchanger configured to absorb heat generated by the one or more superconducting coils using a cryogen, and one or more tubes in fluid communication with the at least one heat exchanger for transferring the cryogen. The cooling assembly may also include a refrigeration device configured to cool the cryogen after the cryogen cools the one or more superconducting coils. The cooling assembly may further include a recycling container configured to accommodate the cryogen, the recycling container being in fluid communication with the one or more tubes and the refrigeration device.

In some embodiments, the at least one heat exchanger may include one or more compartments configured to accommodate at least one of the cryogen or the cooled cryogen. The one or more compartments may be in fluid communication with the recycling container via the one or more tubes.

In some embodiments, a cross section of each of the one or more compartments may have a rectangle shape, a circle shape, or a sawtooth shape.

In some embodiments, the at least one heat exchanger, the one or more tubes, and the recycling container may be located in the inner vessel.

In some embodiments, a top end of each of the one or more tubes in a vertical direction may be lower than or at a same level as an inner bottom of the recycling container.

In some embodiments, the recycling container may have an opening located underneath the refrigeration device.

In some embodiments, the refrigeration device includes a cooling head and a cooling pole. At least a portion of the refrigeration device may be positioned in the inner vessel.

In some embodiments, the cryostat may further include an adjustment component. At least a portion of the adjustment component may be positioned in the inner vessel, and the adjustment component may be configured to adjust a liquid level of the cryogen in the inner vessel by changing a volume of the at least a portion of the adjustment component immersed in the cryogen.

In some embodiments, the cryostat may further a storage component for storing a volume-adjustment medium and a first channel connecting the storage component and the adjustment component. The volume of the at least a portion of the adjustment component immersed in the cryogen may be adjustable by adjusting an amount of the volume-adjustment medium flowing into the adjustment component via the first channel.

In some embodiments, the volume-adjustment medium may include a gas or a liquid.

In some embodiments, the first channel may include a first valve configured to control the flow of the volume-adjustment medium into the adjustment component via the first channel.

In some embodiments, the cryostat may further include a first liquid level sensor configured to determine a first liquid level of the cryogen in the inner vessel, a first pressure sensor configured to determine a first pressure in the adjustment component, and a first control component configured to adjust the amount of the volume-adjustment medium in the adjustment component by controlling the first valve based on the first liquid level and the first pressure.

In some embodiments, the cryostat may further include a third channel connecting the adjustment component and the second channel. The third channel may be configured to allow the vapor of the cryogen to enter the adjustment component. The cryostat may further include a second valve between the second channel and the third channel. An amount of the vapor of the cryogen in the adjustment component may be adjustable by controlling the second valve.

In some embodiments, the cryostat may further include a heating component located in the inner vessel. The heating component may be configured to heat the cryogen in the inner vessel to produce the vapor of the cryogen.

In some embodiments, the cryostat may further include a second liquid level sensor configured to determine a second liquid level of the cryogen in the inner vessel, a second pressure sensor configured to determine a second pressure in the adjustment component, and a second control component configured to adjust, based on the second liquid level and the second pressure, the amount of the vapor of the cryogen in the adjustment component by controlling the second valve or the heating component.

In some embodiments, the cryostat may further include a second channel configured to allow a vapor of the cryogen to exit the inner vessel, one end of the second channel being connected to the inner vessel.

In some embodiments, the cryostat may further include a guide rail on an inner wall of the inner vessel. The adjustment component may be mounted on the guide rail. The volume of the portion of the adjustment component that is immersed in the cryogen may change with a movement of the adjustment component along the guide rail.

In some embodiments, the adjustment component may be solid or hollow.

In some embodiments, the adjustment component may include at least one material selected from a fiber, rubber, latex, or a metal foil.

According to another aspect of the present disclosure, a molding group for manufacturing a thermal shield applied in a cryostat may be provided. The thermal shield may include an internal cylinder having a first end and an external cylinder encompassing the internal cylinder. The external cylinder having a second end. The thermal shield may also include a seal head configured between the internal cylinder and the external cylinder, the seal head having a first edge and a second edge. The thermal shield may further include a connecting component including a plurality of connectors. Each of the plurality of connectors may be configured to connect the first end of the internal cylinder with the first edge of the seal head and/or the second end of the external cylinder with the second edge of the seal head. The molding group may include a first mold and a second mold. The first mold may have a first surface and the second mold may have a second surface. A shape of the first surface may conform to a shape of the second surface, and the first mold and the second mold may be configured to manufacture the plurality of connectors.

According to another aspect of the present disclosure, a method may be provided. The method may include provide an internal cylinder having a first end, an external cylinder having a second end, and a seal head having a first edge and a second edge, and configure a plurality of gaps on an extension of the second end of the external cylinder and/or the first end of the internal cylinder, the extension between adjacent gaps defining a plurality of connectors of a connecting component. The method may also include bend the extension of the second end of the external cylinder and/or the first end of the internal cylinder. The method may further include connect the plurality of connectors to the first edge and/or the second edge of the seal head to form the thermal shield, wherein the external cylinder encompasses the internal cylinder.

According to another aspect of the present disclosure, a method may be provided. The method may include provide an internal cylinder having a first end, an external cylinder having a second end, and a seal head having a first edge and a second edge. The method may also include configure a plurality of gaps on an extension of the first edge and/or the second edge of the seal head, the extension between adjacent gaps defining a plurality of connectors of a connecting component. The method may further include bend the extension of the first edge and/or the second edge of the seal head and connect the plurality of connectors to the first end of the internal cylinder and/or the second end of the external cylinder to form the thermal shield. The external cylinder may encompass the internal cylinder.

According to another aspect of the present disclosure, a superconducting magnet assembly may be provided. The superconducting magnet assembly may include one or more superconducting coils, at least one coil carrier configured to support the one or more superconducting coils, and a cryostat, at least one of the one or more superconducting coils being disposed inside the cryostat. The cryostat may include an inner vessel configured to accommodate one or more superconducting coils, an outer vessel encompassing the inner vessel, and a thermal shield configured between the outer vessel and the inner vessel. The thermal shield may include an internal cylinder having a first end and an external cylinder encompassing the internal cylinder. The external cylinder having a second end. The thermal shield may also include a seal head configured between the internal cylinder and the external cylinder, the seal head having a first edge and a second edge. The thermal shield may further include a connecting component including a plurality of connectors. Each of the plurality of connectors may be configured to connect the first end of the internal cylinder with the first edge of the seal head and/or the second end of the external cylinder with the second edge of the seal head.

According to another aspect of the present disclosure, a cryostat may be provided. The cryostat may include an inner vessel configured to accommodate one or more superconducting coils, an outer vessel encompassing the inner vessel, and a cooling assembly configured to cool the one or more superconducting coils. The cooling assembly may include at least one heat exchanger configured to absorb heat generated by the one or more superconducting coils using a cryogen. The cooling assembly may also include one or more tubes in fluid communication with the at least one heat exchanger for transferring the cryogen. The cooling assembly may further include a refrigeration device configured to cool the cryogen after the cryogen cools the one or more superconducting coils and a recycling container configured to accommodate the cryogen. The recycling container may be in fluid communication with the one or more tubes and the refrigeration device.

According to another aspect of the present disclosure, a superconducting magnet assembly may be provided. The superconducting magnet assembly may include one or more superconducting coils, at least one coil carrier configured to support the one or more superconducting coils; and a cryostat. The cryostat may include an inner vessel configured to accommodate one or more superconducting coils, an outer vessel encompassing the inner vessel, and a cooling assembly configured to cool the one or more superconducting coils. The cooling assembly may include at least one heat exchanger configured to absorb heat generated by the one or more superconducting coils using a cryogen. The cooling assembly may also include one or more tubes in fluid communication with the at least one heat exchanger for transferring the cryogen. The cooling assembly may further include a refrigeration device configured to cool the cryogen after the cryogen cools the one or more superconducting coils and a recycling container configured to accommodate the cryogen. The recycling container may be in fluid communication with the one or more tubes and the refrigeration device.

According to another aspect of the present disclosure, a cryostat may be provided. The cryostat may include an inner vessel configured to accommodate one or more superconducting coils and a cryogen and an outer vessel encompassing the inner vessel. The cryostat may also include an adjustment component. At least a portion of the adjustment component is positioned in the inner vessel, and the adjustment component may be configured to adjust a liquid level of the cryogen in the inner vessel by changing a volume of the at least a portion of the adjustment component immersed in the cryogen.

According to another aspect of the present disclosure, a superconducting magnet assembly may be provided. The superconducting magnet assembly may include one or more superconducting coils, at least one coil carrier configured to support the one or more superconducting coils, and a cryostat. The cryostat may include an inner vessel configured to accommodate one or more superconducting coils and a cryogen and an outer vessel encompassing the inner vessel. The cryostat may also include an adjustment component. At least a portion of the adjustment component is positioned in the inner vessel, and the adjustment component may be configured to adjust a liquid level of the cryogen in the inner vessel by changing a volume of the at least a portion of the adjustment component immersed in the cryogen.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

The following description is presented to enable any person skilled in the art to make and use the present disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but is to be accorded the widest scope consistent with the claims.

It will be understood that the term "system," "engine," "unit," "module," and/or "block" used herein are one method to distinguish different components, elements, parts, section or assembly of different level in ascending order. However, the terms may be displaced by another expression if they may achieve the same purpose.

Figure 2:
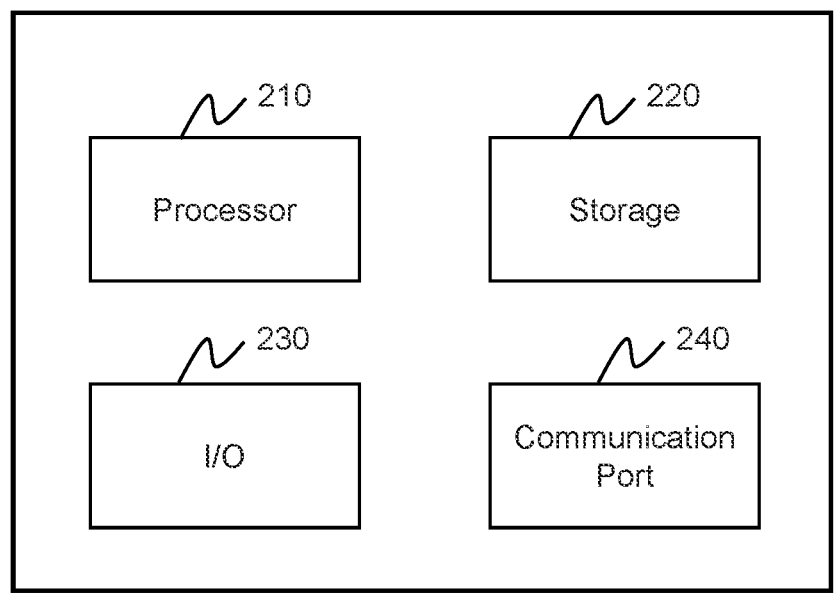
FIG. 2 is a schematic diagram illustrating exemplary hardware and software components of a computing device according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 220 as illustrated in FIG. 2) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an Erasable Programmable Read Only Memory (EPROM). It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments in the present disclosure. It is to be expressly understood, the operations of the flowchart may be implemented not in order. Conversely, the operations may be implemented in inverted order, or simultaneously. Moreover, one or more other operations may be added to the flowcharts. One or more operations may be removed from the flowcharts.

The present disclosure relates to magnetic resonance imaging (MRI) systems, and more particularly, to cryostat devices for MRI systems. A cryostat in an MRI system may be configured to maintain a low working temperature so that one or more superconducting coils accommodated in the cryostat may stay in the superconducting state. The cryostat of the present disclosure may include an inner vessel, an outer vessel encompassing the inner vessel, and a thermal shield configured between the outer vessel and the inner vessel. The inner vessel may be configured to accommodate one or more superconducting coils and a cryogen. The thermal shield may include an internal cylinder, an external cylinder, a seal head, and a connecting component. The internal cylinder may have a first end. The external cylinder may encompass the internal cylinder. The external cylinder may have a second end. The seal head may be configured between the internal cylinder and the external cylinder. The seal head may have a first edge and a second edge. The connecting component may include a plurality of connectors. Each of the plurality of connectors may be configured to connect the first end of the internal cylinder with the first edge of the seal head and/or connect the second end of the external cylinder with the second edge of the seal head.

Figure 1:
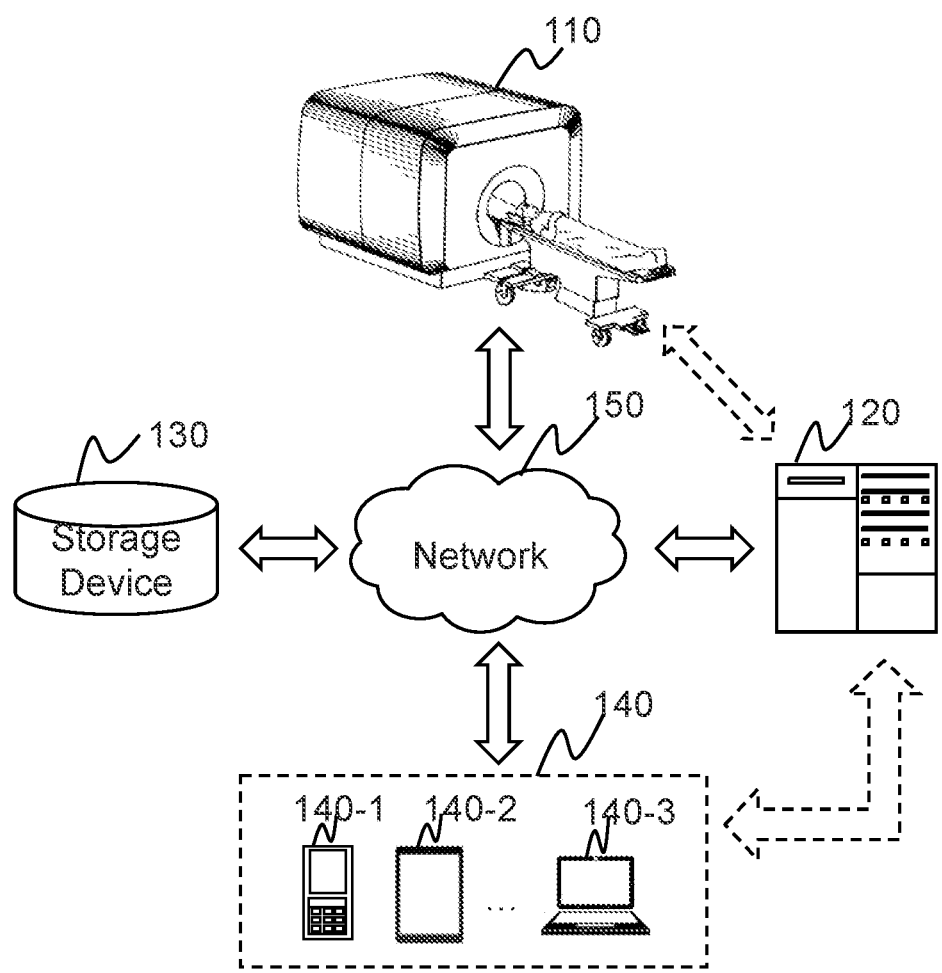
FIG. 1 is a schematic diagram illustrating an exemplary imaging system according to some embodiments of the present disclosure.

FIG. 1 is a schematic diagram illustrating an exemplary magnetic resonance imaging (MRI) system 100 according to some embodiments of the present disclosure. As illustrated, the MRI system 100 may include an MR scanner 110, a processing device 120, a storage device 130, one or more terminals 140, and a network 150. The components in the MRI system 100 may be connected in one or more of various ways. Merely by way of example, as illustrated in FIG. 1, the MR scanner 110 may be connected with the processing device 120 through the network 150. As another example, the MR scanner 110 may be connected with the processing device 120 directly as indicated by the bi-directional arrow in dotted lines linking the MR scanner and the processing device 120. As a further example, the storage device 130 may be connected with the processing device 120 directly or through the network 150. As still a further example, one or more terminals 140 may be connected with the processing device 120 directly (as indicated by the bi-directional arrow in dotted lines linking the terminal(s) 140 and the processing device 120) or through the network 150.

The MR scanner 110 may scan a subject located within its detection region and generate a plurality of data relating to the subject. In the present disclosure, "subject" and "object" are used interchangeably. The MR scanner 110 may include a magnet assembly, a gradient coil assembly, and a radiofrequency (RF) coil assembly The magnet assembly may generate a first magnetic field (also referred to as a main magnetic field) for polarizing the subject to be scanned. The magnet assembly may include a superconducting electromagnet, etc. For example, the superconducting electromagnet (also referred to as superconducting magnet assembly) may use superconducting coils to generate the main magnetic field under a low working temperature for example, lower than 25 Kelvin, or lower than 15 Kelvin, or lower than 4.5 Kelvin, etc. The superconducting magnet assembly may further include a cryostat and a superconducting part. The superconducting part may include superconducting coils and a coil carrier configured to provide support for the superconducting coils. The cryostat may be used to provide a low working temperature for the superconducting part to guarantee the superconducting part stays in a superconducting state. The cryostat may include an outer vessel, a thermal shield, and an inner vessel. More descriptions or the superconducting magnet assembly may be found in elsewhere in the present disclosure (e.g., FIG. 4, FIG. 5, and the descriptions thereof).

The gradient coil assembly may generate a second magnetic field (also referred to as a gradient magnetic field). The gradient coil assembly may include X-gradient coils, Y-gradient coils, and Z-gradient coils. The gradient coil assembly may generate one or more magnetic field gradient pulses to the main magnetic field in the X direction (Gx), the Y direction (Gy), and the Z direction (Gz) to encode the spatial information of the subject. In some embodiments, the X direction may be designated as a frequency encoding direction, while the Y direction may be designated as a phase encoding direction. In some embodiments, Gx may be used for frequency encoding or signal readout, generally referred to as frequency encoding gradient or readout gradient. In some embodiments, Gy may be used for phase encoding, generally referred to as phase encoding gradient. In some embodiments, Gz may be used for slice selection for obtaining 2D k-space data. In some embodiments, Gz may be used for phase encoding for obtaining 3D k-space data.

The RF coil assembly may include a plurality of RF coils. The RF coils may include one or more RF transmit coils and/or one or more RF receiver coils. The RF transmit coil(s) may transmit RF pulses to the subject. Under the coordinated action of the main magnetic field, the gradient magnetic field, and the RF pulses, MR signals relating to the subject may be generated. The RF receiver coils may receive MR signals from the subject. In some embodiments, one or more RF coils may both transmit RF pulses and receive MR signals at different times. In some embodiments, the function, size, type, geometry, position, amount, and/or magnitude of the RF coil(s) may be determined or changed according to one or more specific conditions. For example, according to the difference in function and size, the RF coil(s) may be classified as volume coils and local coils. In some embodiments, an RF receiver coil may correspond to a channel. The RF receiver coil(s) may receive a plurality of channels of MR signals from the subject. The received MR signal(s) may be sent to the processing device 120 directly or via the network 150 for image reconstruction and/or image processing.

The processing device 120 may process data and/or information obtained from the MR scanner 110, the terminal(s) 140, and/or the storage device 130. For example, the processing device 120 may process MR signals of one or more channels obtained from the MR scanner 110 and reconstruct an image of the subject. In some embodiments, the reconstructed image may be transmitted to the terminal(s) 140 and displayed on one or more display devices in the terminal(s) 140. In some embodiments, the processing device 120 may be a single server, or a server group. The server group may be centralized, or distributed. In some embodiments, the processing device 120 may be local or remote. For example, the processing device 120 may access information and/or data stored in the MR scanner 110, the terminal(s) 140, and/or the storage device 130 via the network 150. As another example, the processing device 120 may be directly connected with the MR scanner 110, the terminal(s) 140, and/or the storage device 130 to access stored information and/or data. In some embodiments, the processing device 120 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 120 may be implemented on a computing device 200 having one or more components illustrated in FIG. 2 in the present disclosure.

The storage device 130 may store data and/or instructions. In some embodiments, the storage device 130 may store data obtained from the terminal(s) 140 and/or the processing device 120. In some embodiments, the storage device 130 may store data and/or instructions that the processing device 120 may execute or use to perform exemplary methods described in the present disclosure. In some embodiments, the storage device 130 may include a mass storage device, a removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected with the network 150 to communicate with one or more components of the MRI system 100 (e.g., the processing device 120, the terminal(s) 140, etc.). One or more components of the MRI system 100 may access the data or instructions stored in the storage device 130 via the network 150. In some embodiments, the storage device 130 may be directly connected with or communicate with one or more components of the MRI system 100 (e.g., the processing device 120, the terminal(s) 140, etc.). In some embodiments, the storage device 130 may be part of the processing device 120.

The terminal(s) 140 include a mobile device 140-1, a tablet computer 140-2, a laptop computer 140-3, or the like, or any combination thereof. In some embodiments, the mobile device 140-1 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart footgear, a pair of smart glasses, a smart helmet, a smart watch, smart clothing, a smart backpack, a smart accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google Glass, an Oculus Rift, a Hololens, a Gear VR, etc. In some embodiments, the terminal(s) 140 may remotely operate the MR scanner 110. In some embodiments, the terminal(s) 140 may operate the MR scanner 110 via a wireless connection. In some embodiments, the terminal(s) 140 may receive information and/or instructions inputted by a user, and send the received information and/or instructions to the MR scanner 110 or to the processing device 120 via the network 150. In some embodiments, the terminal(s) 140 may receive data and/or information from the processing device 120. In some embodiments, the terminal(s) 140 may be part of the processing device 120. In some embodiments, the terminal(s) 140 may be omitted.

The network 150 may include any suitable network that can facilitate the exchange of information and/or data for the MRI system 100. In some embodiments, one or more components of the MRI system 100 (e.g., the MR scanner 110, the terminal(s) 140, the processing device 120, or the storage device 130) may communicate information and/or data with one or more other components of the MRI system 100 via the network 150. For example, the processing device 120 may obtain MR signals from the MR scanner 110 via the network 150. As another example, the processing device 120 may obtain user instructions from the terminal(s) 140 via the network 150. In some embodiments, the network 150 may be any type of wired or wireless network, or a combination thereof. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the MRI system 100 may be connected with the network 150 to exchange data and/or information.

The network 150 may include any suitable network that can facilitate exchange of information and/or data for the MRI system 100. In some embodiments, one or more components of the MRI system 100 (e.g., the MR scanner 110, the terminal(s) 140, the processing device 120, the storage device 130, etc.) may transmit or receive information and/or data with one or more other components of the MRI system 100 via the network 150. For example, the processing device 120 may obtain image data from the MR scanner 110 via the network 150. As another example, the processing device 120 may obtain user instructions from the terminal(s) 140 via the network 150. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, witches, server computers, and/or any combination thereof. Merely by way of example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the MRI system 100 may be connected with the network 150 to exchange data and/or information.

FIG. 2 is a schematic diagram illustrating exemplary hardware and/or software components of an exemplary computing device 200 on which the processing device 120 may be implemented according to some embodiments of the present disclosure. As illustrated in FIG. 2, the computing device 200 may include a processor 210, a storage 220, an input/output (I/O) 230, and a communication port 240.

The processor 210 may execute computer instructions (program code) and perform functions of the processing device 120 in accordance with techniques described herein. The computer instructions may include, for example, routines, programs, objects, components, signals, data structures, procedures, modules, and functions, which perform particular functions described herein. For example, the processor 210 may process data obtained from the MR scanner 110, the terminal(s) 140, the storage device 130, and/or any other component of the MRI system 100. Specifically, the processor 210 may process one or more measured data sets obtained from the MR scanner 110. For example, the processor 210 may perform one-dimensional (1D) correction or two-dimensional (2D) correction for the measured data set(s). The processor 210 may reconstruct an image based on the corrected data set(s). In some embodiments, the reconstructed image may be stored in the storage device 130, the storage 220, etc. In some embodiments, the reconstructed image may be displayed on a display device by the I/O 230. In some embodiments, the processor 210 may perform instructions obtained from the terminal(s) 140. In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 200. However, it should be noted that the computing device 200 in the present disclosure may also include multiple processors, thus operations and/or method steps that are performed by one processor as described in the present disclosure may also be jointly or separately performed by the multiple processors. For example, if in the present disclosure the processor of the computing device 200 executes both process A and process B, it should be understood that process A and process B may also be performed by two or more different processors jointly or separately in the computing device 200 (e.g., a first processor executes process A and a second processor executes process B, or the first and second processors jointly execute processes A and B).

The storage 220 may store data/information obtained from the MR scanner 110, the terminal(s) 140, the storage device 130, or any other component of the MRI system 100. In some embodiments, the storage 220 may include a mass storage device, a removable storage device, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 220 may store one or more programs and/or instructions to perform exemplary methods described in the present disclosure. For example, the storage 220 may store a program for the processing device 120 for reducing or removing one or more artifacts in an image.

The I/O 230 may input or output signals, data, and/or information. In some embodiments, the I/O 230 may enable a user interaction with the processing device 120. In some embodiments, the I/O 230 may include an input device and an output device. Exemplary input devices may include a keyboard, a mouse, a touch screen, a microphone, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 240 may be connected with a network (e.g., the network 150) to facilitate data communications. The communication port 240 may establish connections between the processing device 120 and the MR scanner 110, the terminal(s) 140, or the storage device 130. The connection may be a wired connection, a wireless connection, or combination of both that enables data transmission and reception. The wired connection may include an electrical cable, an optical cable, a telephone wire, or the like, or any combination thereof. The wireless connection may include Bluetooth, Wi-Fi, WiMax, WLAN, ZigBee, mobile network (e.g., 3G, 4G, 5G, etc.), or the like, or a combination thereof. In some embodiments, the communication port 240 may be a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
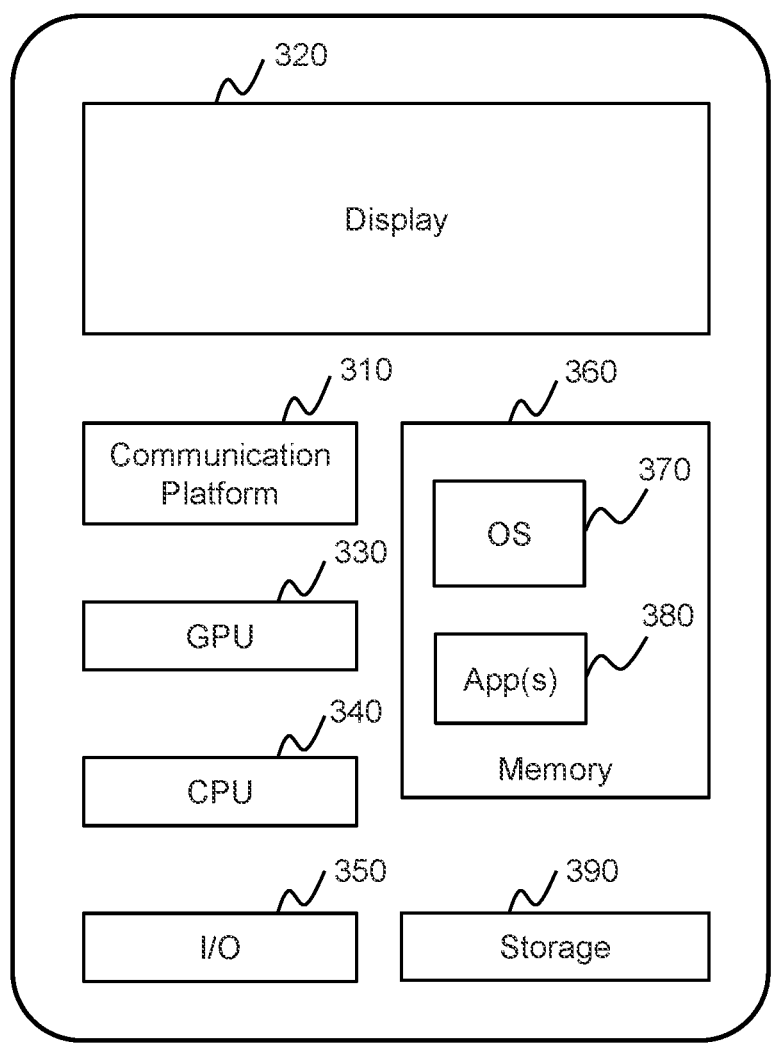
FIG. 3 is a schematic diagram illustrating exemplary hardware and/or software components of an exemplary mobile device according to some embodiments of the present disclosure.

FIG. 3 is a schematic diagram illustrating exemplary hardware and/or software components of an exemplary mobile device 300 according to some embodiments of the present disclosure. As illustrated in FIG. 3, the mobile device 300 may include a communication platform 310, a display 320, a graphic processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300. In some embodiments, a mobile operating system 370 (e.g., iOS, Android, Windows Phone, etc.) and one or more applications 380 may be loaded into the memory 360 from the storage 390 in order to be executed by the CPU 340. The applications 380 may include a browser or any other suitable mobile apps for receiving and rendering information relating to image processing or other information from the processing device 120. User interactions with the information stream may be achieved via the I/O 350 and provided to the processing device 120 and/or other components of the MRI system 100 via the network 150.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to generate an image with reduced Nyquist ghost artifact as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result the drawings should be self-explanatory.

Figure 4:
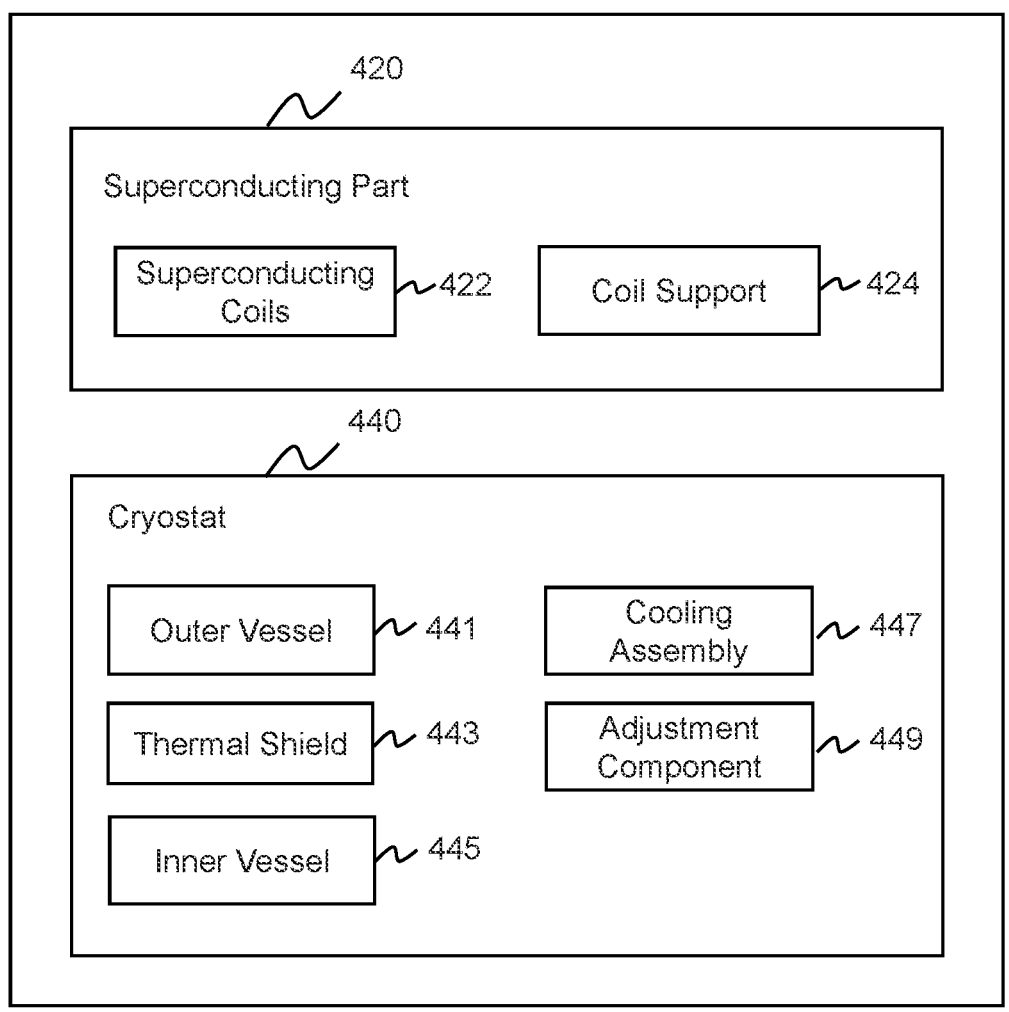
FIG. 4 is a schematic block diagram illustrating an exemplary superconducting magnet assembly according to some embodiments of the present disclosure.

FIG. 4 is a schematic block diagram illustrating an exemplary superconducting magnet assembly 400 according to some embodiments of the present disclosure. The superconducting magnet assembly 400 may include a superconducting part 420 and a cryostat 440.

The superconducting part 420 may include one or more superconducting coils 422 and a coil carrier 424. The one or more superconducting coils 422 may be configured to generate a main magnetic field of a magnitude or a range of magnitudes, for example, from 0.2 T to 7.0 T. The coil carrier 424 may be configured to support and/or fix the superconducting coils 422. In some embodiments, the surface of the coil carrier 424 may be configured with grooves (e.g., trunkings) to accommodate the superconducting coils 422. In some embodiments, the one or more superconducting coils 422 may be mounted on the coil carrier 424 using a connecting technique. Exemplary connecting techniques may include a welding connection, a riveting connection, a locking connection, a pin connection, an adhering connection, a clamp connection, a threaded connection, a pinning connection etc. For example, the one or more superconducting coils 422 may be mounted on the coil carrier 424 using an adhesive, such as an epoxy resin and/or a thermal adhesive. More descriptions for a connection between the superconducting coils 422 and the coil carrier 424 may be found elsewhere in the present disclosure. (e.g., FIG. 19 and the descriptions thereof).

The cryostat 440 may include an outer vessel 441, a thermal shield 443, an inner vessel 445, a cooling assembly 447, and/or an adjustment component 449. The cryostat 440 may allow the superconducting coils 422 to maintain a suitable and stable low working temperature (e.g., 4.5 Kelvin) so as to maintain the superconducting state of the superconducting coils 422.

The outer vessel 441 may include a vacuum container. The outer vessel 441 may encompass the thermal shield 443. The thermal shield 443 may be configured to shield thermal radiations from the outside of the outer vessel 441. The thermal shield 443 may include an inner cylinder and an outer cylinder. A space defined by the inner cylinder and the outer cylinder may be configured to accommodate the inner vessel 445. The thermal shield 443 may further include a seal head and a connecting component. The connecting component may include a plurality of connectors configured to connect edges of the seal head with an end of the inner cylinder and/or the outer cylinder. The end of the inner cylinder and/or the outer cylinder may be also referred to as an edge of the inner cylinder and/or the outer cylinder. In some embodiments, the seal head may include an end cap, a cap, etc. More descriptions for the thermal shield 443 may be found elsewhere in the present disclosure. (e.g., FIGS. 6-15 and the descriptions thereof). The inner vessel 445 may be configured to accommodate the superconducting part 420, a cryogen, at least one portion of the cooling assembly 447, and/or at least a portion of the adjustment component 449. Exemplary cryogens may include a liquid cryogen (e.g., liquid nitrogen, liquid helium, or the like), a solid cryogen (e.g., solid nitrogen, or the like), and a gaseous cryogen (e.g., a gaseous cryogen boiled-off from a liquid cryogen or a solid cryogen), or the like, or a combination thereof.

The cooling assembly 447 may produce, transfer, deliver, channel, or circulate a cooling medium to the inner vessel 445 to absorb heat produced by one or more components of the superconducting magnet assembly 400 (e.g., the superconducting coils 422). In some embodiments, the cooling assembly 447 may include at least one heat exchanger, one or more tubes, a refrigeration device, and a recycling container. The at least one heat exchanger may be operably attached to the superconducting coils 422 to exchange heat with the superconducting coils 422 by heat conduction. Further, the at least one heat exchanger may cool the superconducting coils 422 via a cryogen. The one or more tubes may be in fluid communication with the at least one heat exchanger. The refrigeration device may be configured to cool a used cryogen after the cryogen cools the one or more superconducting coils 422. The recycling container may be configured to accommodate the cryogen after the cryogen cools the superconducting coils 422, and/or the cryogen cooled by the refrigeration device. The recycling container may be in fluid communication with the one or more tubes and the refrigeration device. More descriptions for the cooling assembly 447 may be found elsewhere in the present disclosure. (e.g., FIGS. 16-19 and the descriptions thereof).

The adjustment component 449 may be configured to adjust a liquid level of the cryogen in the inner vessel 445. At least a portion of the adjustment component 449 may be positioned in the inner vessel 445. In some embodiments, the adjustment component 449 may adjust the liquid level of the cryogen in the inner vessel 445 by changing a volume of the at least one portion of the adjustment component 449 in the inner vessel 445. More descriptions for the adjustment component 449 may be found elsewhere in the present disclosure. (e.g., FIGS. 20-26 and the descriptions thereof).

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the cooling assembly 447 and/or the adjustment component 449 may be omitted and the cryogen may be housed in the inner vessel 445.

Figure 5:
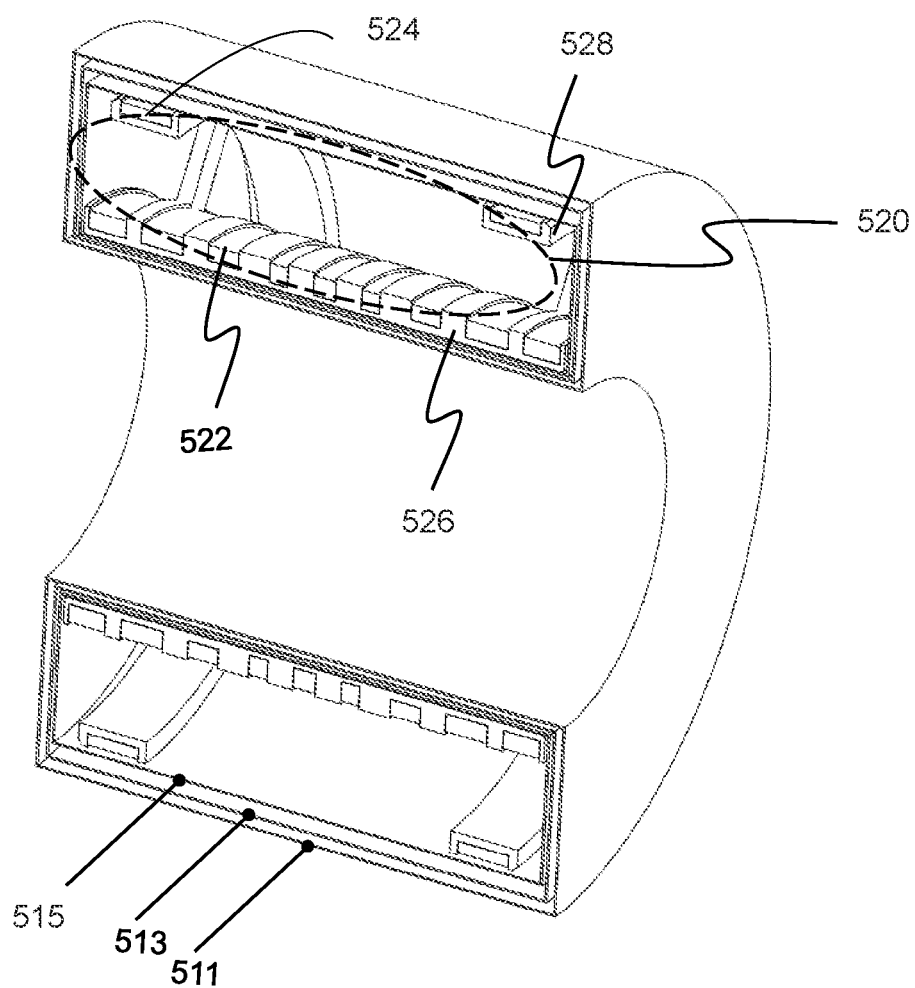
FIG. 5 is a sectional view of an exemplary cryostat according to some embodiments of the present disclosure.

FIG. 5 is a sectional view of an exemplary cryostat 500 according to some embodiments of the present disclosure. As shown in FIG. 5, the cryostat 500 may include an outer vessel 511, a thermal shield 513, and an inner vessel 515. The outer vessel 511 may include a vacuum vessel. The outer vessel 511 may include an inner cylinder and an outer cylinder encompassing the inner cylinder. A first space may be defined by the inner cylinder and the outer cylinder of the outer vessel 511. The first space may be configured to accommodate the thermal shield 513. The thermal shield 513 may include an inner cylinder (also referred to as an internal cylinder) and an outer cylinder (also referred to as an external cylinder) encompassing the inner cylinder. A second space may be defined by the inner cylinder and the outer cylinder of the thermal shield 513. The second space may be configured to accommodate the inner vessel 515. An opening (e.g., the opening 650 sealed by the seal head 630 in FIG. 6) may be defined by a first end of the inner cylinder of the thermal shield 513 and a second end of the outer cylinder of the thermal shield 513. In some embodiments, the thermal shield 513 may include a seal head configured between the internal cylinder and the external cylinder to seal the opening. In some embodiments, the thermal shield 513 may further include a connecting component configured to connect the seal head with the first end of the internal cylinder and/or the second end of the external cylinder. More descriptions for the thermal shield 513 may be found elsewhere in the present disclosure. (e.g., FIGS. 6-15 and the descriptions thereof).

The inner vessel 515 may include an inner cylinder and an outer cylinder encompassing the inner cylinder. A third space may be defined by the inner cylinder and the outer cylinder of the inner vessel 515. The third space may be configured to accommodate a superconducting part 520. The superconducting part 520 may include one or more primary coils 522, one or more secondary coils 524, one or more primary coil frames 526, and one or more secondary coil frames 528. The one or more primary coil frames 526 may be configured to support and/or fix the one or more primary coils 522. The one or more secondary coil frames 528 may be configured to support and/or fix the one or more secondary coils 524. In some embodiments, each of the one or more primary coils 522 (or the secondary coils 524) may be mounted on one of the one or more primary coil frames 526 (or the secondary coil frames 528). In some embodiments, more than one of the one or more primary coils 522 (or the secondary coils 524) may be mounted on one of the one or more primary coil frames 526 (or the secondary coil frames 528). More descriptions for the superconducting part 520 may be found as described elsewhere in the present disclosure (e.g., FIG. 4 and FIG. 19 and the descriptions thereof).

In some embodiments, the inner vessel 515 may also be configured to contain a cryogen configured to cool at least a portion of the superconducting part 520. Exemplary cryogens may include a liquid cryogen (e.g., liquid nitrogen, liquid helium, or the like), a solid cryogen (e.g., solid nitrogen, or the like), and a gaseous cryogen (e.g., a gaseous cryogen boiled-off from a liquid cryogen), or the like, or a combination thereof. In some embodiments, the cryogen may be contained in the third space of the inner vessel 515 so that at least one portion of the superconducting part 520 (e.g., the one or more primary coils 522) may be immersed in the liquid cryogen. A liquid level of the cryogen in the third space of the inner vessel 515 may be in a range to maintain a low working temperature for the superconducting part 520. As used herein, the liquid level of the cryogen refers to a height of the liquid cryogen from the bottom of the inner vessel 515 to the liquid surface in a vertical direction. In some embodiments, the liquid level of the cryogen in the third space of the inner vessel 515 may be adjusted using an adjustment component. At least a portion of the adjustment component may be positioned in the inner vessel 515. In some embodiments, the adjustment component may adjust the liquid level of the cryogen in the inner vessel 515 by changing a volume of the at least a portion of the adjustment component located within the inner vessel 515. In some embodiments, the cryogen may be contained in a cooling assembly. For example, the cooling assembly may include at least one heat exchanger operably attached to the one or more primary coils 522 and/or the secondary coils 524. The at least one heat exchanger may include one or more compartments configured to accommodate the cryogen. The cooling assembly may also include a refrigeration device configured to cool the cryogen after the cryogen cools the one or more primary coils 522 and/or the secondary coils 524. The cooling assembly may further include one or more tubes and a recycling container in fluid communication with the at least one heat exchanger and the refrigeration device. More descriptions for the cooling assembly may be found elsewhere in the present disclosure. (e.g., FIGS. 16-19 and the descriptions thereof).

In some embodiments, at least a portion of the adjustment component may be positioned in the third space defined by the inner cylinder and the outer cylinder of the inner vessel 515. The adjustment component may be configured to adjust a liquid level of the cryogen in the inner vessel 515 by changing a volume of the at least a portion of the adjustment component located within the inner vessel 515. More descriptions for the cooling assembly may be found elsewhere in the present disclosure. (e.g., FIGS. 23, 26, and 28, and the descriptions thereof).

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the cryostat 500 may further include a cooling assembly and/or an adjustment part.

Figure 6:
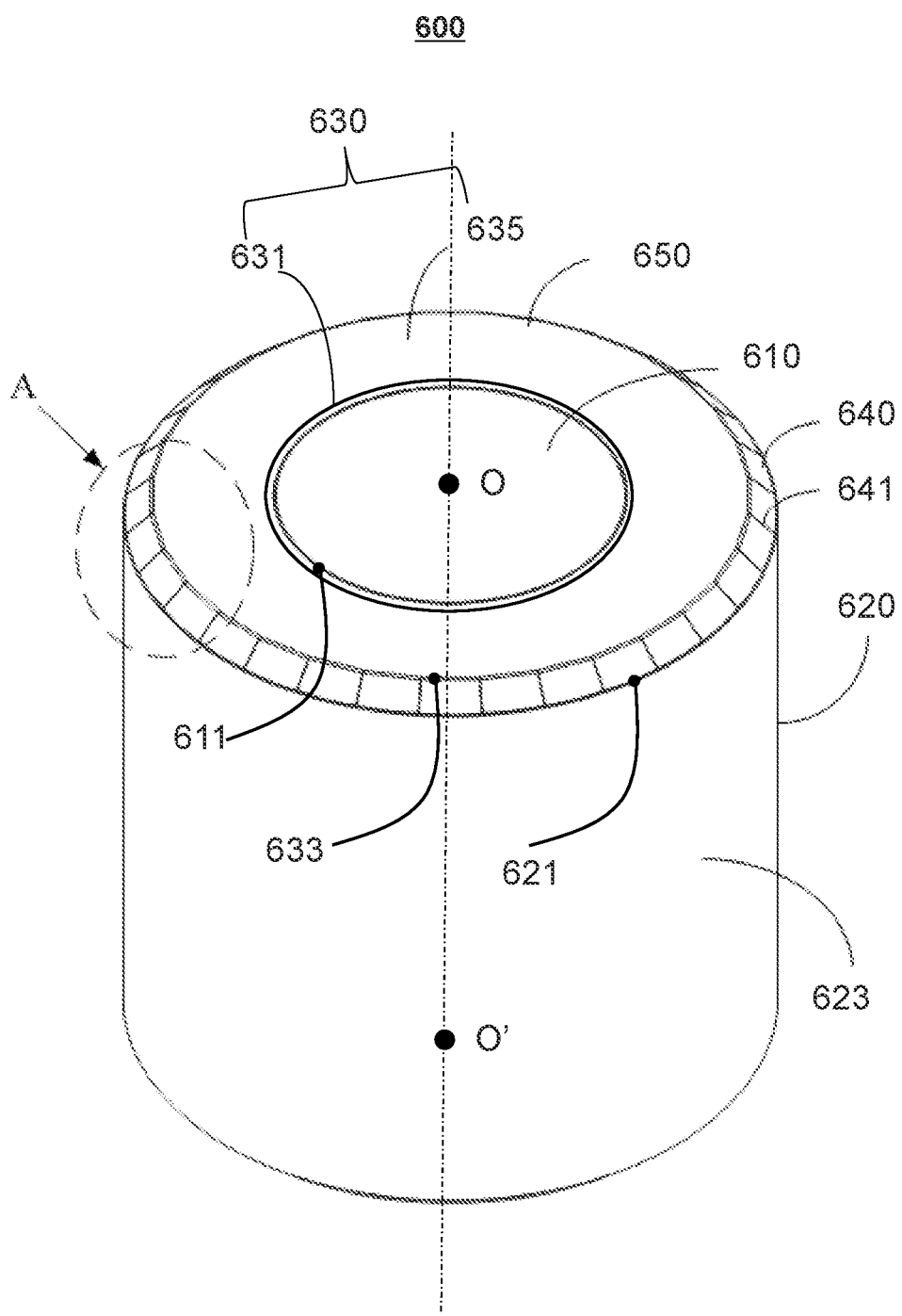
FIG. 6 is a schematic structural diagram illustrating an exemplary thermal shield 600 according to some embodiments of the present disclosure.

FIG. 6 is a schematic structural diagram illustrating an exemplary thermal shield 600 according to some embodiments of the present disclosure. In some embodiments, the thermal shield 600 may include an internal cylinder 610, an external cylinder 620, a seal head 630, and a connecting component 640.

The internal cylinder 610 may have a first end 611 and a first cylindrical surface (not shown). The external cylinder 620 may have a second end 621 and an external cylinder surface 623. The external cylinder 620 may encompass the internal cylinder 610. In some embodiments, the internal cylinder 610 and the external cylinder 620 may be concentric. An opening 650 may be defined by the first end 611 and the second end 621. The seal head 630 may be configured between the internal cylinder 610 and the external cylinder 620 to seal the opening 650 defined by the first end 611 of the internal cylinder 610 and the second end 621 of the external cylinder 620. The seal head 630 may have a first edge 631 corresponding to the first end 611 of the internal cylinder 610 and a second edge 633 corresponding to the second end 621 of the external cylinder 620. The seal head 630 may include a central surface 635 passing through the center of the seal head 630 and perpendicular to the central axis (denoted by a dash-dotted line OO' as shown in FIG. 6) of the internal cylinder 610 and/or the external cylinder 620. In some embodiments, the central surface 635 of the seal head 630 may be substantially or approximately perpendicular to the internal cylinder surface of the internal cylinder 610 and/or the external cylinder surface 623 of the external cylinder 620 on a center section of the thermal shield 600. For instance, the angle between the central surface 635 of the seal head 630 and the internal cylinder surface of the internal cylinder 610 and/or the external cylinder surface 623 of the external cylinder 620 on a center section of the thermal shield 600 may be smaller than 30°, 25°, 20°, 15°, 10°, or 5°. As used herein, the center section refers to a cross section of the thermal shield 600 through the central axis OO' of the internal cylinder 610 and/or the external cylinder 620. In some embodiments, when the seal head 630 seals the opening 650, the first end 611 of the internal cylinder 610 and the first edge 631 of the seal head 630 may correspond to the same spatial position, and the central surface 635 of the seal head 630 and the opening 650 may correspond to the same spatial position.

The connecting component 640 may be configured to connect the seal head 630 with the internal cylinder 610 and/or the external cylinder 620. For illustration purposes, the connecting component 640 for connecting the seal head 630 and the external cylinder 620 may be taken as an example. The connecting component 640 may include a plurality of connectors. Adjacent connectors of the plurality of connectors may be spaced by a gap 641. Each of the plurality of connectors may be configured to connect the second end 621 of the external cylinder 620 with the second edge 633 of the seal head 630. The plurality of connectors may be distributed along a circumferential direction of the seal head 630. More descriptions for the plurality of connectors may be found elsewhere in the present disclosure (e.g., FIG. 7 and the descriptions thereof).

In some embodiments, the surface of each of the plurality of connectors along a direction perpendicular to the radial direction of the internal cylinder 610 and the central axis (or longitudinal axis) OO' of the internal cylinder 610 may incline at an angle with respect to the central surface 635 of the seal head 630 (or around the longitudinal axis and/or transverse center axis of the external cylinder 620). The surface of a connector may be a plane, a regularly curved surface such as a cambered surface, an irregularly curved surface, etc. The surface of the connecting component 640 inclining with respect to the central surface 635 may form a transition structure between the central surface 635 of the seal head 630 and the external cylinder surface 623 of the external cylinder 620. The transition structure between the central surface 635 and the external cylinder surface 623 may be a non-right angle structure. The connecting component 640 may take the form of, such as, a circular bead, a chamfering, a lace structure, etc. In some embodiments, the angle between the transition structure (i.e., the connecting component 640) and the central surface 635 may range from 2 degrees to 90 degrees, or 10 degrees to 60 degrees, or 40 degrees to 60 degrees, etc.

In some embodiments, the connecting component 640 may be manufactured by separately molding with the external cylinder 620 and the seal head 630 using a molding technique. Exemplary molding techniques may include a casting molding technique, a forging molding technique, an injection molding technique, etc. Further, the connecting component 640 may be connected with the seal head 630 and the external cylinder 620 respectively using a connecting technique as described elsewhere in the present disclosure. For example, the connecting component 640 may be connected with the second edge 633 of the seal head 630 and the second end 621 of the external cylinder 620 via welding to form a connection between the seal head 630 and the external cylinder 620. In some embodiments, the connecting component 640 may be manufactured by integral molding of the external cylinder 620, or the seal head 630. For example, the connecting component 640 (e.g., the plurality of connectors) may be formed by bending a first extension of the second end 621 of the external cylinder 620. Then the connecting component 640 may be connected with the second edge 633 via, for example, welding, riveting, etc., to form a connection between the seal head 630 and the external cylinder 620. As another example, the connecting component 640 (e.g., the plurality of connectors) may be formed by bending a second extension of the second edge 633 of the seal head 630. Then the connecting component 640 may be connected with the second end 621 of the external cylinder 620 via, for example, welding, riveting, etc., to form a connection between the seal head 630 and the external cylinder 620. More descriptions for forming the connecting component 640 may be found elsewhere in the present disclosure (e.g., FIGS. 14-15 and the descriptions thereof).

In some embodiments, one or more components of the thermal shield 600 may be made of a thermally conductive material, such as a metal or an alloy thereof. For example, the thermal shield 600 may be made of an aluminum alloy for better heat conduction and shield. The transition structure may be formed by a slanted connecting component connecting the central surface 635 and the external cylinder surface 623, compared to a connecting component at a right angle with the external cylinder surface 623. For brevity, such a transition structure is referred to as a non-right-angled structure. A non-right-angled transition structure may reduce the stress concentration on the transition structure and therefore reduce the needed mechanical strength of the seal head 630, the internal cylinder 610, and/or the external cylinder 620, which in turn may allow the use of the seal head 630, the internal cylinder 610, and/or the external cylinder 620 of less thickness. Additionally or alternatively, the non-right-angled transition structure, compared to a right-angled transition, may reduce a length of the cryostat. This may further reduce a probability of a claustrophobia effect on an object (e.g., a human) to be scanned induced by the MR scanner 110.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the seal head 630 may be directly connected with the internal cylinder 610 and/or the external cylinder 620 using a connecting technique as described elsewhere in the present disclosure. As another example, the thermal shield 600 may further include a cover layer configured to cover the gap between adjacent connectors. In some embodiments, the connecting component 640 may further include a base. The plurality of connectors may be mounted on the base.

Figure 7:
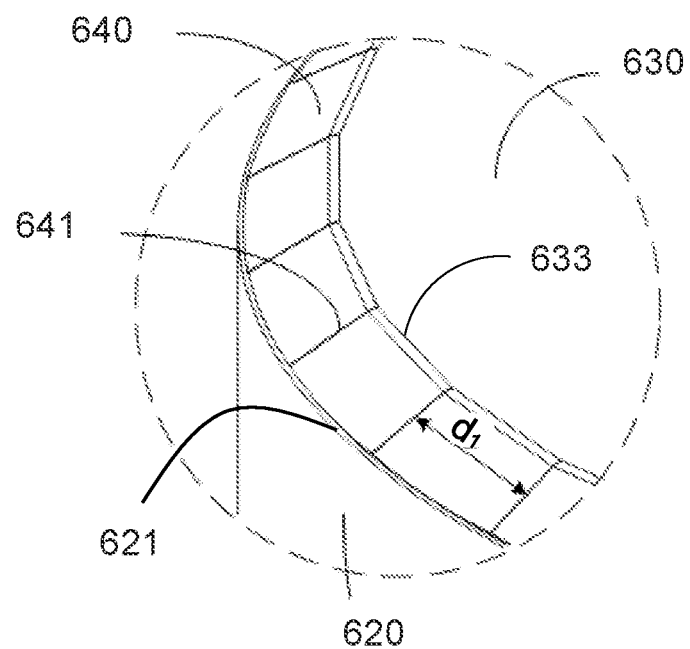
FIG. 7 is an enlarged view illustrating portion A of the connecting component 640 shown in FIG. 6 according to some embodiments of the present disclosure.

FIG. 7 is an enlarged view illustrating portion A of the connecting component 640 shown in FIG. 6 according to some embodiments of the present disclosure. As shown in FIG. 7, the connecting component 640 may be configured to connect the second edge 633 of the seal head 630 with the second end 621 of the external cylinder 620. The connecting component 640 may include a plurality of connectors. Adjacent connectors of the plurality of connectors may be spaced by the gap 641. A connector may have a width, represented by $d_1$, in a direction perpendicular to the radial direction of the internal cylinder 610 (not shown in FIG. 7) and the central axis of the internal cylinder 610, or along a circumferential direction of the seal head 630. In some embodiments, the width $d_1$ of a connector may range from 20 millimeters to 300 millimeters.

In some embodiments, the width $d_1$ of a connector may be constant along a direction from the second edge 633 of the seal head 630 to the second end 621 of the external cylinder 620. In some embodiments, the width $d_1$ of a connector may vary (e.g., increase, decrease, or increase first then decrease) along the direction from the second edge 633 of the seal head 630 to the second end 621 of the external cylinder 620. Under this condition, the connector may have a non-rectangle shape such as a trapezoid shape. In some embodiments, the width $d_1$ of each of the plurality of connectors may be the same or different. In some embodiments, the width $d_1$ of a connector may be measured midway between the second edge 633 of the seal head 630 to the second end 621 of the external cylinder 620.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the connecting component 640 may be configured between the internal cylinder (not shown) and the seal head 630.

Figure 8:
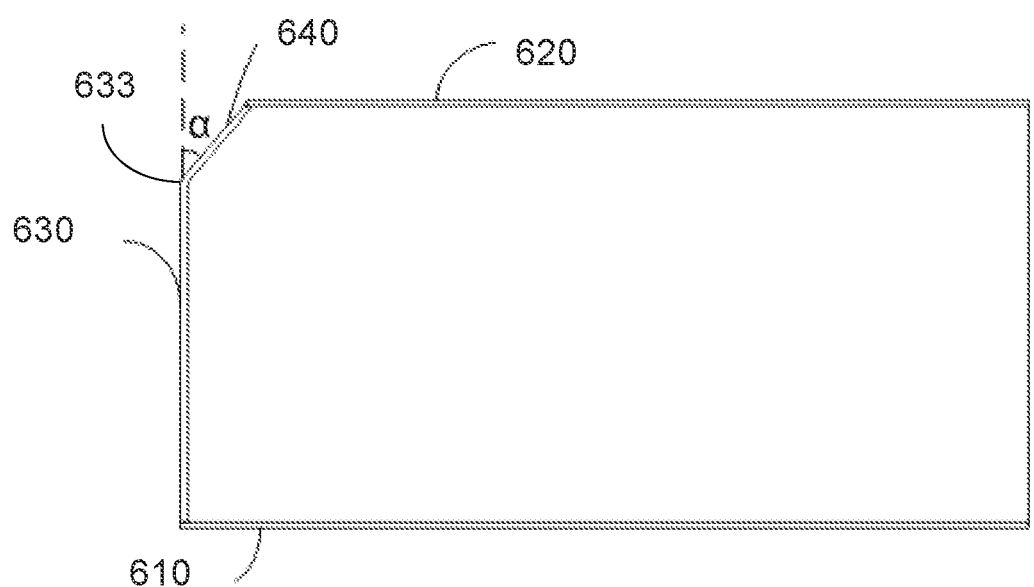
FIG. 8 is a sectional view of the thermal shield 600 according to some embodiments of the present disclosure.

FIG. 8 is a sectional view of the thermal shield 600 according to some embodiments of the present disclosure. As shown in FIG. 8, the sectional view of the thermal shield 600 is along the center section of the internal cylinder 610 of the thermal shield 600 as described in FIG. 6. The connecting component 640 may be configured to connect the seal head 630 with the external cylinder 620. The connecting component 640 may be manufactured by integral molding of the seal head 630. Further, the connecting component 640 may be formed by bending an extension (i.e., the second extension) of the second edge 633 of the seal head 630 toward the external cylinder 620. Then the second extension of the second edge 633 of the seal head 630 (i.e., the connecting component 640) may be connected with the external cylinder 620 via for example, welding, riveting, etc.

The surface of the connecting component 640 may incline at an angle with respect to the surface of the seal head 630 to form the transition structure between the seal head 630 with the external cylinder 620. In some embodiments, the connecting component 640 may take the form of a chamfering structure, a circular bead structure, a lace structure, etc. In some embodiments, an angle α between the surface of the connecting component 640 and the surface of the seal head 630 may be in the range from 2 degrees to 90 degrees.

The connecting component 640 may provide a smooth transition between the seal head 630 and the internal cylinder 610 and/or the external cylinder 620. The connecting component 640 may reduce the edge stress between the seal head 630 and the external cylinder 620, reduce the thickness of the internal cylinder 610, the external cylinder 620, and the seal head 630, and reduce the cost of manufacturing a thermal shield.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the connecting component 640 may be formed by bending an extension (i.e., the first extension) of the second end of the external cylinder 620 toward the seal head 630.

Figure 9:
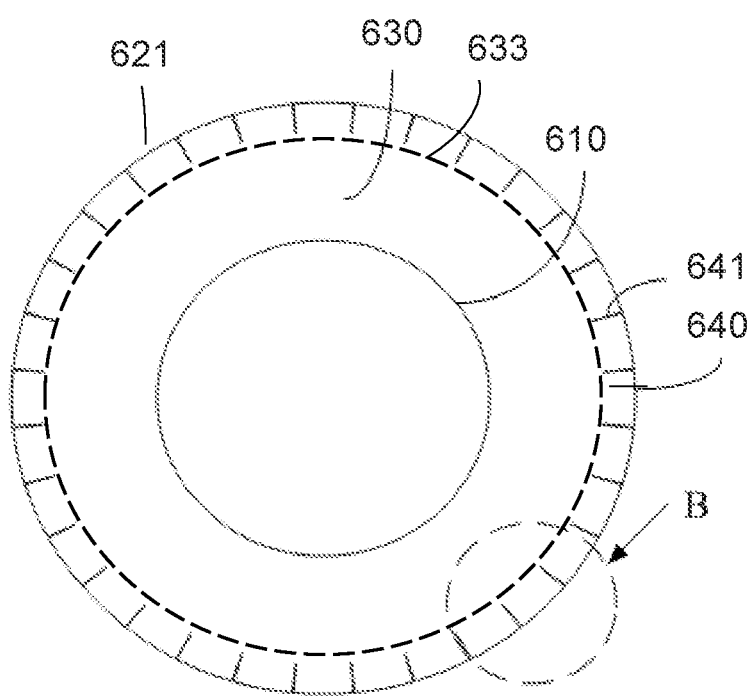
FIG. 9 is a top view of the thermal shield 600 as shown in FIG. 6 according to some embodiments of the present disclosure.

FIG. 9 is a top view 900 of the thermal shield 600 as shown in FIG. 6 according to some embodiments of the present disclosure. As shown in FIG. 9, the connecting component 640 may include a plurality of connectors. The plurality of connectors may be manufactured by integral molding of the seal head 630. For example, a plurality of gaps (e.g., the gap 641) may be configured on an extension (i.e., the second extension) of the second edge 633 of the seal head 630. Adjacent gaps may define one of the plurality of connectors. The second extension of the second edge 633 of the seal head 630 may be further bent toward the external cylinder 620 by pressure to form the plurality of connectors. The connecting component 640 may incline with respect to the seal head 630. In some embodiments, the plurality of connectors of the connecting component 640 may be connected with the second end 621 of the external cylinder 620 through a connecting technique (e.g., a welding connection, a riveting connection, a threaded connection, a pinning connection, etc.).

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the seal head 630 may be connected with the internal cylinder 610 via the connecting component 640. The connecting component 640 may be formed by bending the second extension of the first edge 631 (not shown in FIG. 9) of the seal head 630. In some embodiments, the connecting component 640 and the seal head 630 may be manufactured separately. The connecting component 640 may be connected with the seal head 630 through a connecting technique (e.g., a welding connection, a riveting connection, a threaded connection, a pinning connection, etc.).

Figure 10:
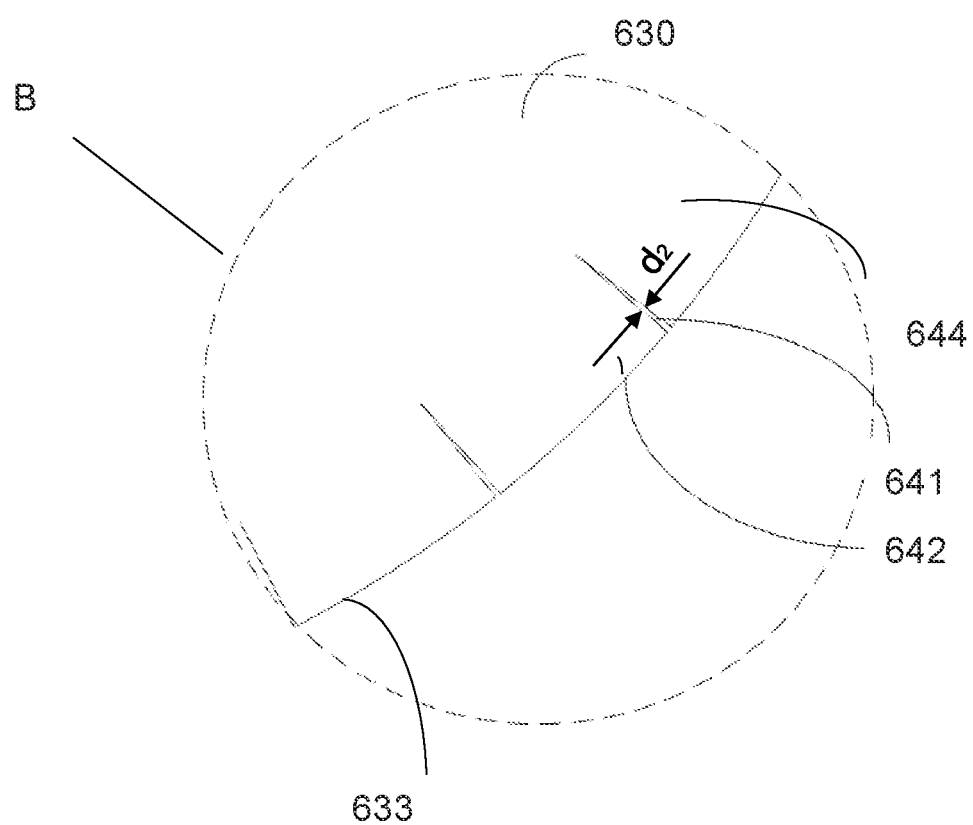
FIG. 10 is an enlarged view illustrating portion B of the thermal shield 600 as shown in FIG. 9 according to some embodiments of the present disclosure.

FIG. 10 is an enlarged view illustrating portion B of the thermal shield 600 as shown in FIG. 9 according to some embodiments of the present disclosure. As described in FIG. 9, the connecting component 640 may include the plurality of connectors. Adjacent connectors (e.g., a connector 642 and a connector 644) of the plurality of connectors may be spaced by the gap 641. The gap 641 may have a width, represented by $d_2$, in a direction perpendicular to the radial direction of the internal cylinder 610 (not shown in FIG. 10) and the central axis of the internal cylinder 610, or along the circumferential direction of the seal head 630. The connecting component 640 may be formed by bending the second extension of the second edge 633 of the seal head 630. In some embodiments, the width $d_2$ of the gap 641 may be configured to increase along the direction from the second edge 633 of the seal head 630 to the second end 621 of the external cylinder 620 before the second extension of the second edge 633 of the seal head 630 is bent. The gap 641 may have a V-shape to avoid the overlap between the connector 642 and the connector 644 after the second extension is bent toward the external cylinder 620. In some embodiments, a maximum of the width $d_2$ (also referred to as a maximum width of a gap) may range from 1 millimeter to 20 millimeters before the second extension are bent toward the external cylinder 620. After the second extension is bent to form the connector 642 and the connector 644, the width $d_2$ may have the same value or different values, compared to before the bending, along the direction from the second edge 633 of the seal head 630 to the second end 621 of the external cylinder 620. In some embodiments, the width $d_2$ may be measured midway between the second edge 633 of the seal head 630 and the second end 621 of the external cylinder 620

In some embodiments, the thermal shield 600 may further include a cover layer configured to cover the gap 641 after the seal head 630 has been connected with the external cylinder 620 through the connecting component 640. The cover layer may be formed using an adhesive. In some embodiments, the cover layer may further include a filling material configured to fill the gap 641. The filling material may be a welding material. The cover layer may be configured to provide an airtight seal.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the plurality of gaps may be configured on an extension of the second end (e.g., the second end 622 as shown in FIG. 6) of the external cylinder (e.g., the external cylinder 620 as shown in FIG. 6). A portion of the extension of the second end between adjacent gaps of a plurality of gaps may form a connector. The width of a gap may increase along a direction of the center axis of the external cylinder 620 before the connecting component is bent.

Figure 11:
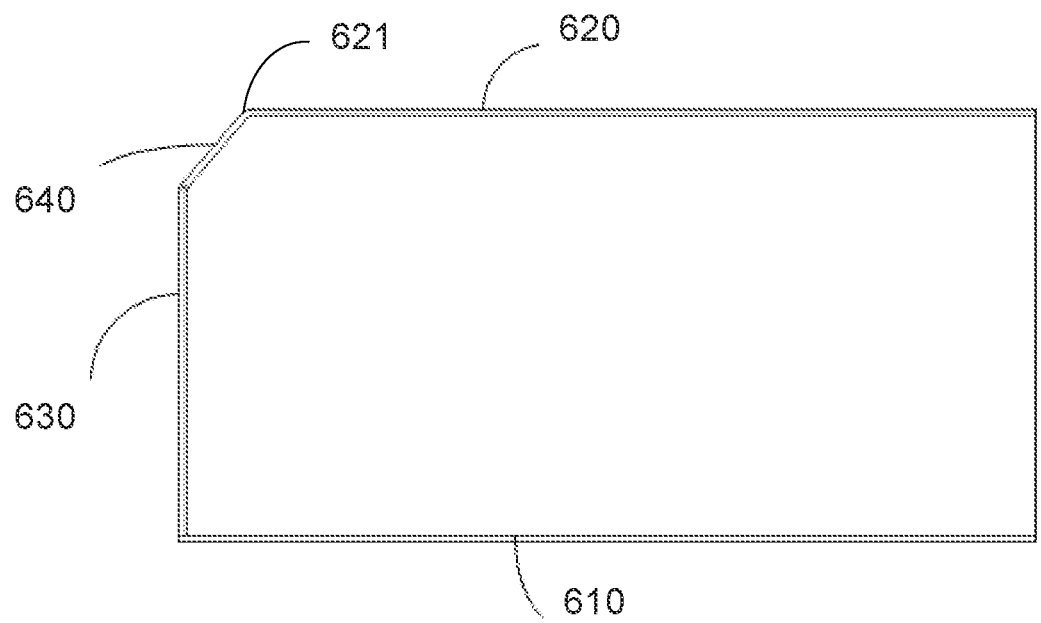
FIG. 11 is a sectional view of the thermal shield 600 according to some embodiments of the present disclosure.

FIG. 11 is a sectional view of the thermal shield 600 according to some embodiments of the present disclosure. As shown in FIG. 11, the sectional view of the thermal shield 600 is along the center section of the internal cylinder 610 of the thermal shield 600 as shown in FIG. 6. The connecting component 640 may be configured to connect the external cylinder 620 with the seal head 630. The connecting component 640 may be manufactured by integral molding of the external cylinder 620. Further, the connecting component 640 may be formed by bending an extension (i.e., the first extension) of the second end 621 of the external cylinder 620 toward the seal head 630. Then the connecting component 640 may be connected with the seal head 630 via for example, welding, riveting, etc.

The surface of the connecting component 640 may incline at an angle with respect to the surface of the external cylinder 620 to form the transition structure between the external cylinder 620 and the seal head 630. In some embodiments, the connecting component 640 may take the form of a chamfering structure, a circular bead structure, a lace structure, etc. In some embodiments, an angle α (not shown in FIG. 11) between the surface of the connecting component 640 and the surface of the seal head 630 may be in the range from 2 degrees to 90 degrees. More descriptions for the angle α may be found elsewhere in the present disclosure (e.g., FIG. 6 and the descriptions thereof).

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the connecting component 640 may be formed by bending an extension (i.e., the second extension) of the second edge of the seal head 630 toward the external cylinder 620. The connecting component 640 may be formed by bending an extension (i.e., the first extension) of the second end of the external cylinder 620 toward the seal head 630.

Figure 12:
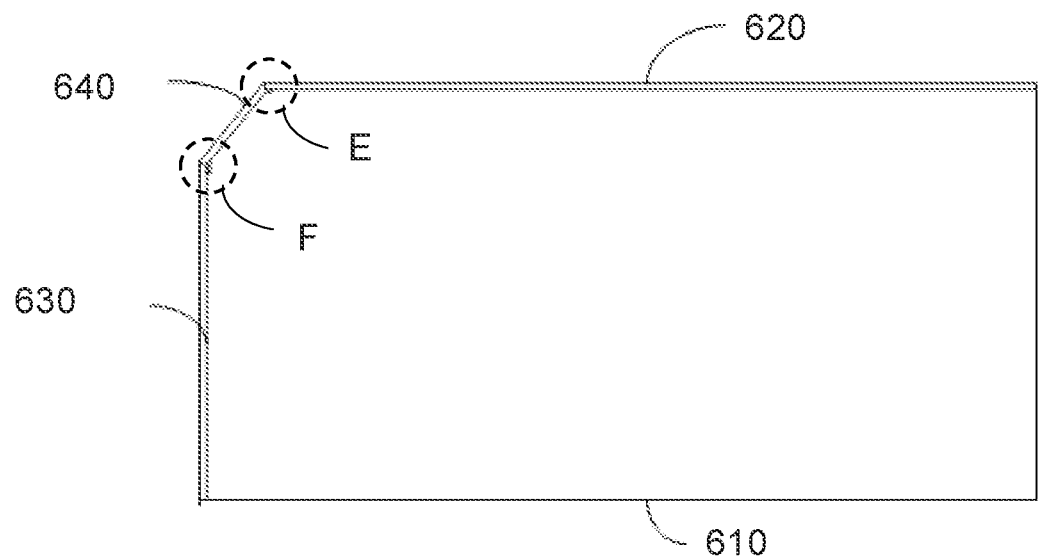
FIG. 12 is a sectional view of the exemplary thermal shield 600 according to some embodiments of the present disclosure.

FIG. 12 is a sectional view of the thermal shield 600 according to some embodiments of the present disclosure. As shown in FIG. 12, the sectional view of the thermal shield 600 is along the center section of the internal cylinder 610 of the thermal shield 600 as shown in FIG. 6. The connecting component 640 may be configured to connect the external cylinder 620 and the seal head 630. The connecting component 640 may be manufactured separately from the seal head 630 and the external cylinder 620. Further, the connecting component 640 may be connected with the seal head 630 and/or the external cylinder 620 using a connecting technique. Exemplary connecting techniques may include a welding connection, a riveting connection, a locking connection, a pin connection, an adhering connection, a clamp connection, a threaded connection, a pinning connection etc.

As shown by a region E in FIG. 12, the connecting component 640 may be connected with the external cylinder 620 using a first connecting technique. As shown by region F in FIG. 12, the connecting component 640 may be connected with the seal head 630 using a second connecting technique. The first connecting technique may be the same as or different from the second connecting technique. For example, the connecting component 640 may be connected with the second end 621 of the external cylinder 620 using the welding connection. The connecting component 640 may be connected with the second edge 633 of the seal head using the riveting connection. As another example, the connecting component 640 may be connected with the second end 621 of the external cylinder 620 and the second edge 633 of the seal head using the riveting connection.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the connecting component 640 may be configured between the internal cylinder 610 and the seal head 630 to connect the internal cylinder 610 with the seal head 630.

Figure 13:
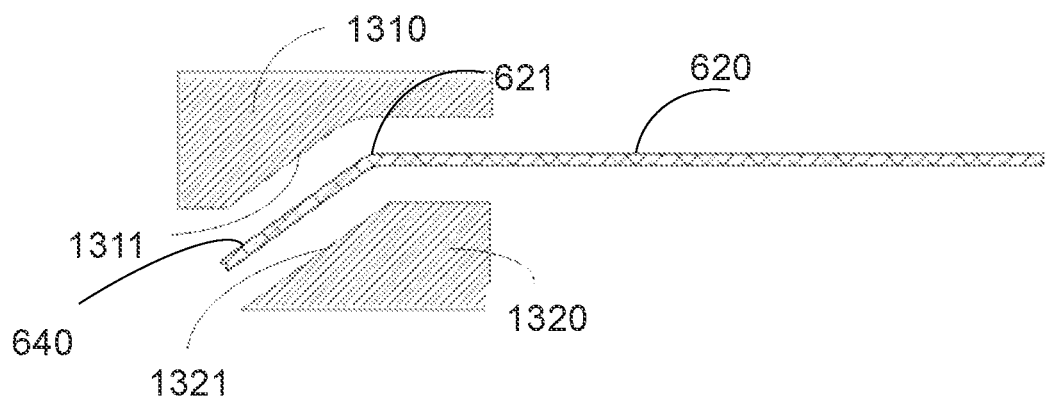
FIG. 13 is a schematic diagram of an exemplary molding group for manufacturing a thermal shield according to some embodiments of the present disclosure.

FIG. 13 is a schematic diagram of an exemplary molding group 1300 for manufacturing the thermal shield 600 according to some embodiments of the present disclosure. The molding group 1300 may include a first mold 1310 and a second mold 1320. The first mold 1310 may have a first surface 1311. The second mold 1320 may have a second surface 1321. The shape of the first surface 1311 may conform to the shape of the second surface 1321. The first mold 1310 and the second mold 1320 may be configured to form the plurality of connectors of the connecting component 640 of the thermal shield 600 as described elsewhere in the present disclosure. In some embodiments, at least one of the plurality of connectors of the connecting component 640 may be formed independently from each other. For example, the extension (i.e., the second extension) of the second end 621 of the external cylinder 620 may be configured with a plurality of gaps. The extension of the second end 621 may be divided into multiple portions by the plurality of gaps. Each of the multiple portions may correspond to one of the plurality of connectors of the connecting component 640. The first mold 1310 and the second mold 1320 may be placed at two sides of one or more portions of the extension of the external cylinder 620, respectively. A pressure may be applied to the first mold 1310 and the second mold 1320 to bend the one or more portions of the extension of the external cylinder 620. The one or more portions of the bent extension of the external cylinder 620 may form one or more connectors. The shape of the first surface 1311 and the shape of the second surface 1321 may conform to the shape of a connector of the connecting component 640.

In some embodiments, a width of the molding group 1300 may be less than or equal to the maximum of the width $d_1$ of a connector of the connecting component 640 as described elsewhere in present disclosure (e.g., FIG. 6 and the descriptions thereof).

During the process of manufacturing the connecting component 640, the needed pressure may be reduced by using the molding group 1300. This may further simplify the process of manufacturing the connecting component 640.

Figure 14:
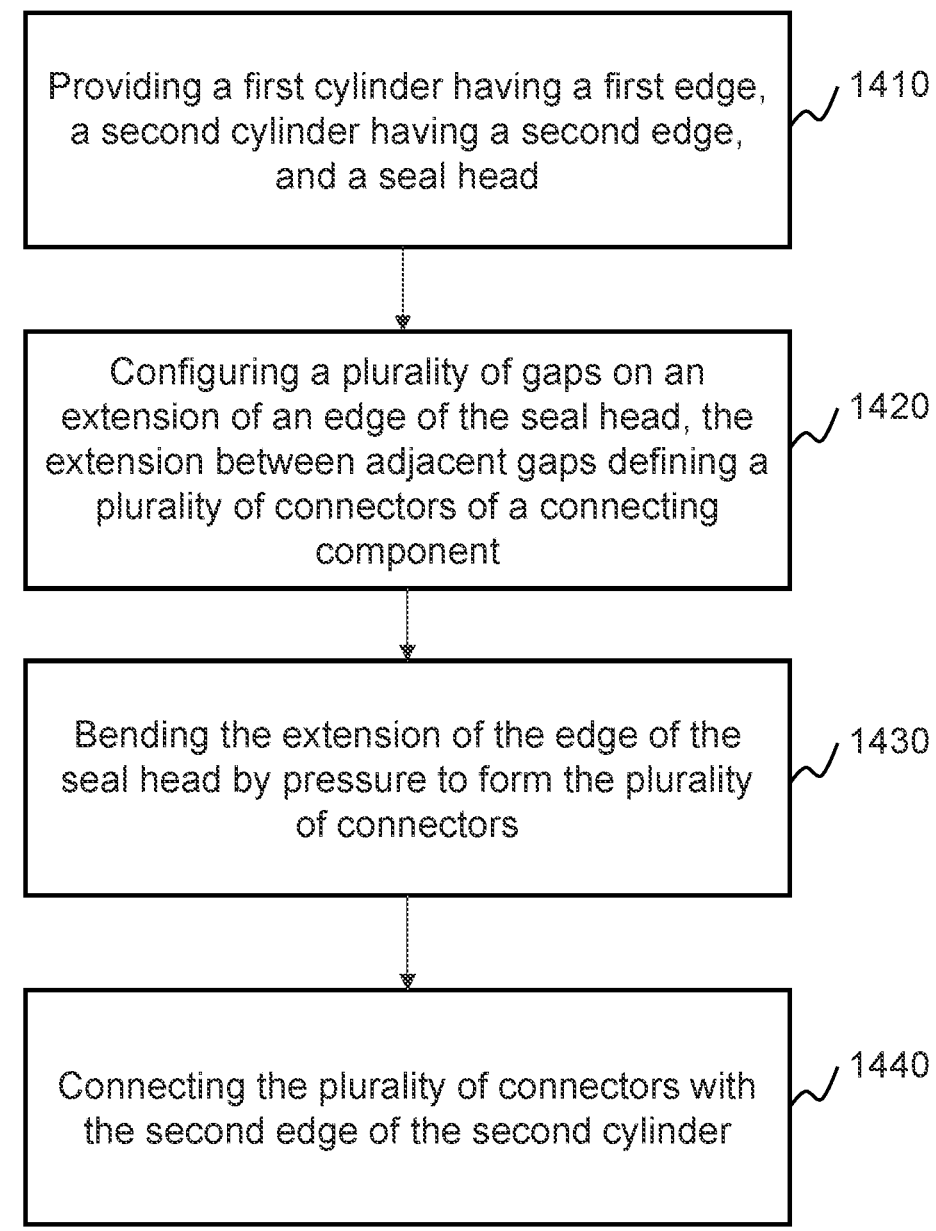
FIG. 14 is a flowchart illustrating an exemplary process for manufacturing a thermal shield according to some embodiments of the present disclosure.

FIG. 14 is a flowchart illustrating an exemplary process 1400 for manufacturing a thermal shield according to some embodiments of the present disclosure.

In 1410, an internal cylinder having a first end, an external cylinder having a second end, and a seal head may be provided. The internal cylinder (e.g., the internal cylinder 610) may be located in the external cylinder (e.g., the external cylinder 620) concentrically. The external cylinder (e.g., the external cylinder 620) may encompass the internal cylinder (e.g., the internal cylinder 610). The diameter of the first edge (e.g., the first edge 631) may be smaller than that of the second edge (e.g., the second edge 633). More descriptions for the internal cylinder, the external cylinder, and the seal head may be found elsewhere in the present disclosure (e.g., FIG. 6 and the descriptions thereof).

In 1420, a plurality of gaps may be configured on an extension of an edge of the seal head. In some embodiments, the seal head may be configured with a first region and a second region. The first region may be a central region that defines the central surface of the seal head (e.g., the central surface 635). The second region may be an edge region configured to form a connecting component (e.g., the connecting component 640). The edge region may also be referred to as the extension of the edge (e.g., the first edge or the second edge) of the seal head. The extension of the edge of the seal head may be divided into multiple portions by, for example, cutting the edge region. The multiple portions between adjacent gaps of the plurality of gaps may define a plurality of connectors of the connecting component (e.g., the connecting component 640). Each of the multiple portions may correspond to one of the plurality of connectors of the connecting component (e.g., the connecting component 640). The connecting component may be configured to connect the seal head with the external cylinder. The width of a gap (e.g., the width $d_2$ of the gap 641 as shown in FIG. 10) on a direction perpendicular to the radial direction of the seal head may increase along the radial direction of the seal head from the center of the seal head to the second edge of the seal head (e.g., the second edge 633 of the seal head 630 as shown in FIG. 10). A maximum of the width (also referred to as a maximum width) of each of the plurality of gaps may be in the range from 1 millimeter to 20 millimeters.

In 1430, the extension of the edge of the seal head may be bent by pressure to form the plurality of connectors. In some embodiments, the operation 1430 may be performed using the molding group 1300 as described in FIG. 13. Further, each of the multiple portions of the extension between adjacent gaps may be placed between the first mold 1310 and the second mold 1320. The first mold 1310 and the second mold 1320 may be applied a pressure to bend the each of the multiple portions of the extension between adjacent gaps to form a connector. The width of each of the plurality of gaps may increase along the radial direction of the seal head from the center of the seal head to the edge of the seal head that may avoid overlap between adjacent connectors when the extension of the edge of the seal head is bent.

In 1440, the plurality of connectors may be connected with the second end of the external cylinder. Each of the plurality of connectors may be connected with the second end of the external cylinder using a connecting technique as described elsewhere in the present disclosure. For example, the each of the plurality of connectors may be connected with the second end of the external cylinder using a welding connection, a riveting connection, etc.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, an operation of determining the first region and the second region of the sea head may be added before the operation 1410. In some embodiments, a connecting component configured to connect the seal head and the internal cylinder may be manufactured according to process 1400. For example, a plurality of gaps may be configured on an extension region associated with the first edge of the seal head. The extension region associated with the first edge of the seal head may be bent to connect the first edge of the seal head with the first end of the internal cylinder.

Figure 15:
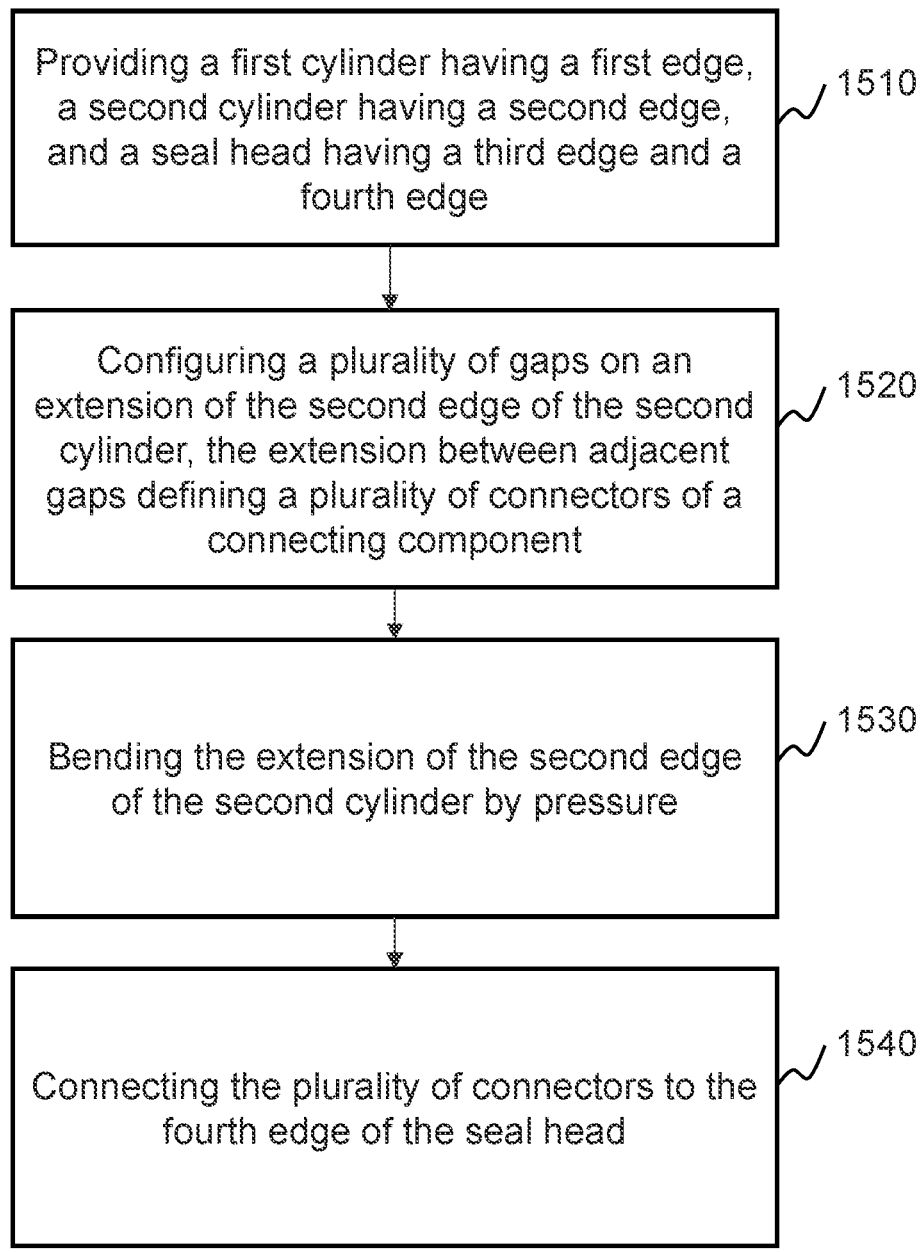
FIG. 15 is flowchart illustrating an exemplary process for manufacturing a thermal shield according to some embodiments of the present disclosure.

FIG. 15 is a flowchart illustrating an exemplary process 1500 for manufacturing a thermal shield according to some embodiments of the present disclosure.

In 1510, an internal cylinder having a first end, an external cylinder having a second end, and a seal head having a first edge and a second edge may be provided. The internal cylinder (e.g., the internal cylinder 610) may be located in the external cylinder (e.g., the external cylinder 620) concentrically. The external cylinder (e.g., the external cylinder 620) may encompass the internal cylinder (e.g., the internal cylinder 610). The diameter of the first edge (e.g., the first edge 631) may be smaller than that of the second edge (e.g., the second edge 633). The seal head may further include a central surface (e.g., central surface 635) defined by the first edge (e.g., the first edge 631) and the second edge (e.g., the second edge 633). More descriptions for the internal cylinder, the external cylinder, and the seal head may be found elsewhere in the present disclosure (e.g., FIG. 6 and the descriptions thereof).

In 1520, a plurality of gaps may be configured on an extension associated with the second end of the external cylinder. In some embodiments, the external cylinder may be configured with a first region and a second region. The first region may be a central region that defines the central surface of the external cylinder (e.g., the external cylinder surface 623). The second region may be an edge region configured to form a connecting component (e.g., the connecting component 640). The edge region may also be referred to as the extension of the second end of the seal head. The extension of the second end of the external cylinder may be divided into multiple portions by, for example, cutting the edge region. The multiple portions between adjacent gaps of the plurality of gaps may define a plurality of connectors of the connecting component (e.g., the connecting component 640). Each of the multiple portions may correspond to one of the plurality of connectors of the connecting component (e.g., the connecting component 640). The connecting component may be configured to connect the seal head with the external cylinder. The width of a gap (e.g., the width $d_2$ of the gap 641 as shown in FIG. 10) on a direction perpendicular to the radial direction of the seal head may increase along the radial direction of the seal head from the center of the seal head to the second edge of the seal head (e.g., the second edge 633 of the seal head 630 as shown in FIG. 10). A maximum of the width of each of the plurality of gaps may be in the range from 1 millimeter to 20 millimeters.

In 1530, the extension of the edge of the external cylinder may be bent by pressure to form the plurality of connectors. In some embodiments, the operation 1430 may be performed using the molding group 1300 as described in FIG. 13. Further, each of the multiple portions of the extension between adjacent gaps may be placed between the first mold 1310 and the second mold 1320. The first mold 1310 and the second mold 1320 may be applied a pressure to bend the each of the multiple portions of the extension between adjacent gaps to form a connector. The width of each of the plurality of gaps may increase along the radial direction of the seal head from the center of the seal head to the edge of the seal head that may avoid overlap between adjacent connectors when the extension of the edge of the seal head is bent.

In 1540, the plurality of connectors may be connected with the second edge of the seal head. Each of the plurality of connectors may be connected with the second edge of the seal head using a connecting technique as described elsewhere in the present disclosure. For example, the each of the plurality of connectors may be connected with the second edge of the seal head using a welding connection, a riveting connection, etc.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, an operation of forming the internal cylinder/external cylinder and determining the first region/second region may be added before the operation 1510. In some embodiments, a connecting component configured to connect the seal head and the internal cylinder may be manufactured according to process 1500. For example, a plurality of gaps may be configured on an extension region associated with the first end of the internal cylinder. The extension region associated with the first end of the internal cylinder may be bent to connect the first end of the internal cylinder with the first edge of the seal head.

Figure 16:
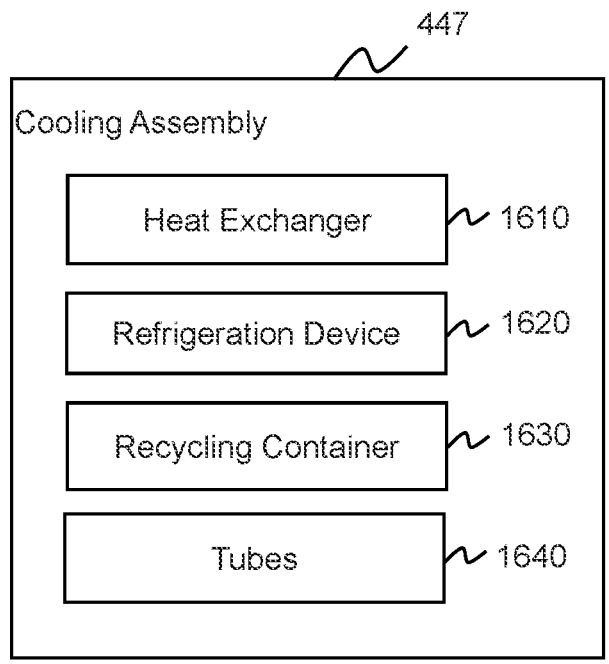
FIG. 16 is a schematic block diagram of an exemplary cooling assembly of a cryostat according to some embodiments of the present disclosure.

FIG. 16 is a schematic structural diagram of an exemplary cooling assembly 447 according to some embodiments of the present disclosure. The cooling assembly 447 may be configured to cool superconducting coils (e.g., the superconducting coils 422 as shown in FIG. 4), superconducting switches, etc., for an MR scanner.

As shown in FIG. 16, the cooling assembly 447 may include a heat exchanger 1610, a refrigeration device 1620, a recycling container 1630, and a plurality of tubes 1640. The heat exchanger 1610 may absorb and transfer heat generated by the superconducting coils using a cryogen (e.g., liquid helium). The heat exchanger 1610 may be located in the vicinity of the superconducting coils. For example, the heat exchanger 1610 may be located on the surface of the superconducting coils. In some embodiments, the configuration between the heat exchanger 1610 and the superconducting coils may be various. For example, one superconducting coil may be configured with a heat exchanger. As another example, more than one superconducting coil may be configured to share one heat exchanger 1610.

The heat exchanger 1610 may include one or more compartments configured to accommodate the cryogen. The one or more compartments may be in fluid communication with the recycling container 1630 via the plurality of tubes 1640.

The refrigeration device 1620 may be configured to cool the cryogen after the cryogen cools the superconducting coils. The refrigeration device 1620 may include a cooling head and a cooling pole. The cooling head may include a compressor configured to increase the pressure of a cryogen to generate compressed cryogen. The cooling pole may include a condenser configured to condense the compressed cryogen.

The recycling container 1630 may be configured to accommodate the cryogen after the cryogen cools the superconducting coils and/or the cryogen that is cooled by the refrigeration device 1620. The recycling container 1630 may be in fluid communication with the refrigeration device 1620 and/or the heat exchanger 1610 via the plurality of tubes 1640. For example, the cryogen after cooling the superconducting coils may flow into the recycling container 1630 via the plurality of tubes 1640 from the heat exchanger 1610. As another example, the cryogen after cooling the superconducting coils may flow into the refrigeration device 1620 from the recycling container 1630. As still an example, the cryogen cooled by the refrigeration device 1620 may be stored in the recycling container 1630.

The plurality of tubes 1640 may be in fluid communication with the heat exchanger 1610, the refrigeration device 1620, and the recycling container 1630. For example, the cryogen may flow to the recycling container 1630 from the heat exchanger 1610 via a portion of the plurality of tubes 1640 after the cryogen cools the superconducting coils. As another example, the cryogen cooled by the refrigeration device 1620 may flow into the at least heat exchanger 1610 via another portion of the plurality of tubes. More descriptions for the cooling assembly may be found elsewhere in the present disclosure. (e.g., FIG. 17 and the descriptions thereof). Each of the plurality of tubes 1640 may include a top end and a bottom end. The top end of each of the plurality of tubes 1640 may be connected with the recycling container 1630. The bottom end of each of the plurality of tubes 1640 may be connected with a compartment of the heat exchanger 1610. The top end of each of the plurality of tubes 1640 may be lower than or at the same level as an inner bottom of the recycling container 1630.

As introduced above, the heat exchanger 1610, the refrigeration device 1620, the recycling container 1630, and the plurality of tubes 1640 may form a communicating vessel. The cryogen may be produced, transferred, delivered, channeled, or circulated to absorb heat produced by one or more components to be cooled (e.g., the superconducting coils) in the communicating vessel. The cryogen in the communicating vessel may be liquid (e.g., liquid nitrogen, liquid helium, or the like), gaseous (e.g., gaseous helium boiled-off from liquid helium), or the like, or a combination thereof. A liquid state and a gaseous state of the cryogen may be converted into each other during a process of cooling the superconducting coils. For example, the cryogen may be poured into the recycling container 1630 and flow into the one or more compartments of the heat exchanger 1610 via the plurality of tubes 1640. Heat generated by the superconducting coils may be conducted to the cryogen accommodated in the one or more compartments of the heat exchanger 1610. The cryogen may be heated (also referred to as the heated or used cryogen). In some embodiments, the heated cryogen may convert to gaseous cryogen. The heated cryogen may flow to the recycling container 1630 or the refrigeration device 1620 via the plurality of tubes 1640. Because at least one portion of the cryogen, by absorbing heat, may gasify and convert into the gaseous cryogen, the refrigeration device 1620 may collect the heated cryogen (e.g., the gaseous cryogen) and cool the heated cryogen. The cooled cryogen may be acquired by the recycling container 1630 and flow back to the one or more compartments of the heat exchanger 1610 via the plurality of tubes 1640. Thus, based on a fluid communication between the one or more compartments and refrigeration device 1620 via the recycling container 1630 and the plurality of tubes 1640, the superconducting coils may be cooled efficiently to remain at a low working temperature. Compared with a conventional way, this cooling technique may lower the consumption of the cryogen and further lower the operation cost of the MR scanner 110. Also, the cryogen flowing in the one or more compartments of the heat exchanger 1610 may increase a heat exchange efficiency between the heat exchanger 1610 and the superconducting coils.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the recycling container 1630 may be omitted.

Figure 17:
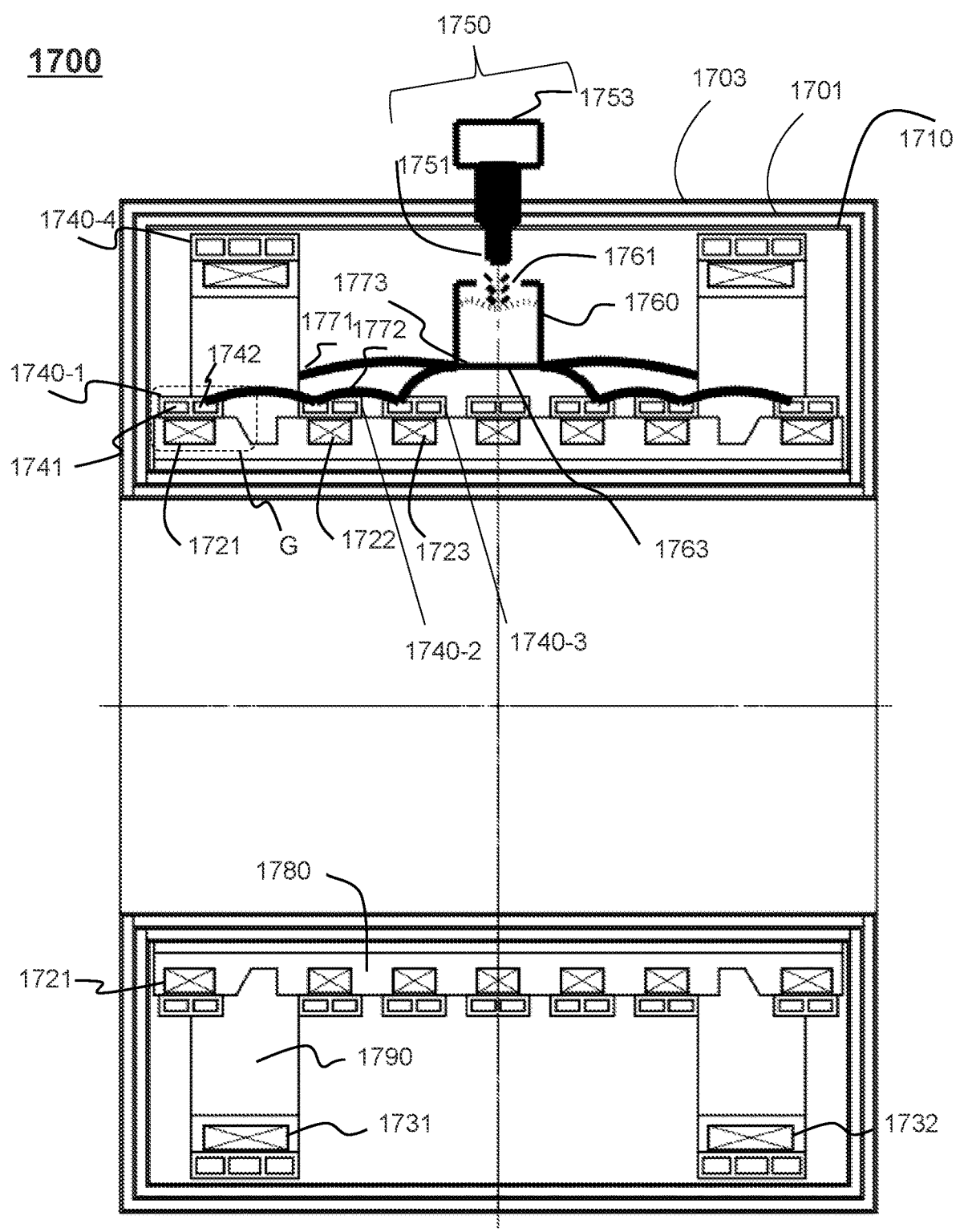
FIG. 17 is a sectional view of an exemplary cryostat according to some embodiments of the present disclosure.

FIG. 17 is a sectional view of an exemplary cryostat 1700 according to some embodiments of the present disclosure. As illustrated in FIG. 17, the cryostat 1700 may include an inner vessel 1710, a thermal shield 1701, and an outer vessel 1703. More descriptions for the outer vessel, the thermal shield and the inner vessel may be found elsewhere in the present disclosure. (e.g., FIGS. 5 and 6, and the descriptions thereof). The inner vessel 1710 may include a space (also referred to as a third space introduced in FIG. 5 and the descriptions thereof) configured to accommodate a superconducting part and at least one portion of a cooling assembly.

In some embodiments, the superconducting part may include one or more superconducting coils and a coil carrier. The superconducting coils may include one or more primary coils (e.g., a primary coil 1721, a primary coil 1722, a primary coil 1723, etc.) and one or more secondary coils (e.g., a secondary coil 1731, a secondary coil 1732, etc.). The primary coils and the secondary coils may be concentric. A number of the primary coils and a number of the secondary coils may be the same or different. In some embodiments, each of the primary coils (e.g., the primary coil 1721) may have a first annular structure and each of the secondary coils (e.g., the secondary coil 1731) may have a second annular structure. The radius of the first annular structure may be smaller than the radius of the second annular structure. In some embodiments, a primary coil (e.g., the primary coil 1721) may have an inner surface. A secondary coil (e.g., the secondary coil 1731) may have an outer surface. The radius of the outer surface may be larger than that of the inner surface.

The coil carrier may be configured to fix and/or support the superconducting coils. The coil carrier may include a primary coil carrier 1780 and a secondary coil carrier 1790. The primary coil carrier 1780 may be configured to support and/or fix the primary coils (e.g., the primary coil 1721, the primary coil 1722, the primary coil 1723, etc.). The primary coil carrier 1780 may be configured with a plurality of trunkings configured to accommodate the primary coils. The secondary coil carrier 1790 may be configured to support and/or fix the secondary coils (e.g., the secondary coil 1731, the secondary coil 1732, etc.). The secondary coil carrier 1790 may be configured with a plurality of trunkings configured to accommodate the secondary coils. The plurality of trunkings configured on the primary coil carrier 1780 and the secondary coil carrier 1790 may prevent the superconducting coils from moving.

The cooling assembly may include a plurality of heat exchangers (e.g., a heat exchanger 1740-1, a heat exchanger 1740-2, a heat exchanger 1740-3, etc.), a refrigeration device 1750, a recycling container 1760, and a plurality of tubes (e.g., a tube 1771, a tube 1772, a tube 1773, etc.).

The plurality of heat exchangers (e.g., the heat exchanger 1740-1) may be configured to absorb and conduct heat generated by the superconducting coils (e.g., the primary coil 1721, etc.) using a cryogen (e.g., liquid helium). In some embodiments, one or more superconducting coils may share one of the plurality of heat exchangers. For example, each of the superconducting coils (e.g., the primary coil 1721) may be configured with a heat exchanger (e.g., the heat exchanger 1740-1). As another example, the primary coil 1721 and the primary coil 1722 may share the heat exchanger 1740-1.

A heat exchanger (e.g., the heat exchanger 1740-1) may include one or more compartments (e.g., a compartment 1741) configured to accommodate a cryogen or a cooled cryogen after the cryogen is cooled by the refrigeration device 1750. The one or more compartments may be in fluid communication with the recycling container 1760 and/or the refrigeration device 1750 via the plurality of tubes. For example, the cryogen in the compartment 1741 may be heated and flow into the recycling container 1760 via the tube 1771 after cooling the primary coil 1721. As another example, the heated cryogen may be cooled by the refrigeration device 1750. The cooled cryogen may flow into the compartment 1742 via the tube 1772 from the recycling container 1760 or the refrigeration device 1750. In some embodiments, the number (or count) of the one or more compartments of a heat exchanger (e.g., the heat exchanger 1740-1) may be the same as or different from that of another heat exchanger (e.g., the heat exchanger 1740-4). For example, each of the plurality of heat exchangers may be configured with two compartments, or three compartments. As another example, a heat exchanger (e.g., the heat exchanger 1740-4) associated with a secondary coil may be configured with three compartments and a heat exchanger (e.g., the heat exchanger 1740-1) associated with a primary coil may be configured with two compartments. In some embodiments, the one or more compartments may be connected with each other in parallel or in series. The connected one or more compartments may be further connected with the recycling container 1760 through one of the plurality of tubes. Under this condition, a temperature of the cryogen in different compartments may be (substantially) the same, leading to a (substantially) uniform temperature of the superconducting coils. In some embodiments, each of the one or more compartments may be connected with the recycling container 1760 separately. More descriptions for the one or more compartments 1741 may be found elsewhere in the present disclosure. (e.g., FIG. 19 and the descriptions thereof).

The plurality of heat exchangers may cover the superconducting coils (e.g., the primary coil 1721, etc.). Further, the plurality of heat exchangers may be distributed on surfaces (inner surfaces and/or outer surfaces) of the superconducting coils (e.g., the primary coil 1721 and the secondary coil 1731). In some embodiments, a heat exchanger may be placed on the surface of a superconducting coil (e.g., the primary coil 1721) along a circumferential direction of the cryostat 1700 to form an annular structure. For example, the heat exchanger 1740-1 may be configured on the inner surface and/or the outer surface of the primary coil 1721. The shape of the heat exchanger 1740-1 may fit that of the inner surface and/or the outer surface of the primary coil 1721 on the circumferential direction of the cryostat 1700. In some embodiments, a heat exchanger may be placed on the surfaces of the superconducting coils (e.g., the primary coil 1721, the primary coil 1722, the primary coil 1723, etc.) along an axial direction of the cryostat 1700 to form a straight-line structure or a curved structure. In some embodiments, a heat exchanger (e.g., the heat exchanger 1740-1) may be an integral ring placed on the surface of a superconducting coil (e.g., the primary coil 1721) along the circumferential direction of the cryostat 1700. In some embodiments, a heat exchanger (e.g., the heat exchanger 1740-1) may include a plurality of partial rings distributed on the surface (the inner surface and/or outer surface) of the superconducting coil (e.g., the primary coil 1721) along the circumferential direction of the cryostat 1700 to form a ring. In some embodiments, the plurality of partial rings may be distributed on the surfaces (the inner surfaces and/or outer surfaces) of the superconducting coils (e.g., the primary coil 1721, the primary coil 1722, the primary coil 1723, etc.) along the axial direction of the cryostat 1700 to form a straight-line structure or a curved structure. Each of the plurality of partial rings of the heat exchanger (e.g., the heat exchanger 1740-1) may include one or more compartments. The compartments in the plurality of partial rings may be connected with each other through a portion of the plurality of tubes. The partial rings may be manufactured conveniently, and have a smaller volume and a lower cost.

In some embodiments, a heat exchanger (e.g., the heat exchanger 1740-1) in the integral ring may be sheathed and assembled on the inner surface and/or the outer surface of a superconducting coil (e.g., the primary coil 1721).

In some embodiments, a heat exchanger may be mounted on the coil carrier via a connecting technique as described elsewhere in the present disclosure (e.g., FIG. 6 and the descriptions thereof). For example, a heat exchanger may include a plurality of partial rings. Each of the plurality of partial rings may be mounted on the coil carrier via rivets, bolts, etc. In some embodiments, the size of a heat exchanger (e.g., the length d1 of the heat exchanger 1740-1 as shown in FIG. 17) may equal or exceed that of the trunking where a superconducting coil (e.g., the primary coil 1721) corresponding to the heat exchanger is located in along the axial direction of the cryostat 1700. Further, the plurality of heat exchangers may close the openings of the plurality of trunkings on the coil carrier. In some embodiments, the inner diameter of a heat exchanger (e.g., the heat exchanger 1740-1) may be equal to or exceed the outer diameter of the coil carrier (e.g., the primary coil carrier 1780) associated with the heat exchanger. In other words, a gap (e.g., a gap S as shown in FIG. 17) may be formed between the heat exchanger (e.g., the heat exchanger 1740-1) and the coil carrier (e.g., the primary coil carrier 1780). More descriptions for the heat exchanger may be found elsewhere in the present disclosure. (e.g., FIG. 18 and the descriptions thereof).

The plurality of heat exchangers may be made from a metal or an alloy thereof, such as copper, aluminum alloy, etc. In some embodiments, a heat exchanger may be manufactured using a molding technique. Exemplary molding techniques may include a casting molding technique, a forging molding technique, an injecting molding technique, etc. In some embodiments, a heat exchanger may be formed by winding a section material (e.g., an aluminum extruded section, a square steel, etc.). After the heat exchanger is formed by winding the section material, the heat exchanger may be further processed to snugly fit the section material.

The refrigeration device 1750 may be configured to cool the cryogen after the cryogen cools the superconducting coils. The refrigeration device 1750 may be a refrigerator or a condenser. The refrigeration device 1750 may be in fluid communication with the plurality of tubes and/or the recycling container 1760. For example, the cryogen may be transferred to the refrigeration device 1750 from the recycling container 1760 to be cooled. As another example, the cooled cryogen may be transferred to the plurality of heat exchangers via the plurality of tubes. The refrigeration device 1750 may include cooling pole 1751 and a cooling head 1753. The cooling head 1753 may include a compressor configured to increase the pressure of the cryogen to generate the compressed cryogen. The cooling pole 1751 may include a condenser configured to condense the compressed cryogen. In some embodiments, at least a portion of the refrigeration device 1750 may be accommodated in the inner vessel 1710 of the cryostat 1700. For example, the cooling pole 1751 may be located inside the inner vessel 1710 and the cooling head 1753 may be located outside of the inner vessel 1710. As another example, the cooling pole 1751 and the cooling head 1753 may be both located inside the inner vessel 1710. In some embodiments, the refrigeration device 1750 may be located outside the inner vessel 1710. The refrigeration device 1750 may be configured on the top of the recycling container 1760. The recycling container 1760 may be configured with an opening 1761. In some embodiments, at least a portion of the refrigeration device 1750 may be located within the recycling container 1760 via the opening 1761. For example, the cooling pole 1751 and/or at least a portion of the cooling head may be located in the recycling container 1760. Further, the cooling pole 1751 or the at least a portion of the cooling head may be coupled with the opening 1761 to seal the opening 1761.

The recycling container 1760 may be configured to accommodate a cryogen. In some embodiments, the recycling container 1760 may include one or more imports and one or more exports. The recycling container 1760 may be connected with the plurality of tubes via the one or more inlets and the one or more outlets. Further, the recycling container 1760 may be in fluid communication with the plurality of tubes (e.g., the tube 1771, the tube 1772, the tube 1773, etc.) and the refrigeration device 1750. For example, the recycling container 1760 may collect the cryogen flowing from the tube 1771 after the cryogen cools the primary coil 1721 via an inlet and transfer the cryogen to the refrigeration device 1750 through the opening 1761. As another example, the recycling container 1760 may acquire the cryogen cooled by the refrigeration device 1750 and further transport the cooled cryogen to the heat exchanger 1740-1 through the tube 1772 via an outlet.

In some embodiments, the plurality of tubes may be in fluid communication with the plurality of heat exchangers and the recycling container 1760. For example, the heat exchanger 1740-1 may be in fluid communication with the recycling container 1760 with the tube 1771. In some embodiments, the plurality of tubes may be in fluid communication with the one or more compartments of each the plurality of heat exchangers. For example, a compartment of the heat exchanger 1740-1, a compartment of the heat exchanger 1740-2, and a compartment of the heat exchanger 1740-3 may be connected in series to be in fluid communication. In some embodiments, a position of each of the plurality of tubes in a vertical direction may be lower than or at the same level as an inner bottom 1763 of the recycling container 1760. This may result in a height difference between the one or more compartments of each of the plurality of heat exchangers and each of the plurality of tubes. In this case, the cryogen may flow to the one or more compartments more easily.

The one or more compartments of each of the plurality of heat exchangers, the plurality of tubes, the refrigeration device 1750, and the recycling container 1760 may constitute a communicating vessel. If the opening 1761 of the recycling container 1760 is sealed, the communicating vessel may be a sealed vessel, and the cryogen may only flow in the one or more compartments of each of the plurality of heat exchangers, the plurality of tubes, the refrigeration device 1750, and the recycling container 1760. The communicating vessel may be poured with a certain volume (e.g., 100 litres) of the cryogen to maintain a level of the cryogen high enough in the communicating vessel. In this case, the consumption of the cryogen may be reduced by, e.g., at least 50%, or at least 60%, or at least 70%, or at least 80%, or approximately 90%. In some embodiments, if the opening 1761 of the recycling container 1760 is not sealed, the communicating vessel may be open and the cryogen may flow in the one or more compartments of each of the plurality of heat exchangers, the plurality of tubes, the refrigeration device 1750, the recycling container 1760, and the inner vessel 1710. When a certain volume (e.g., over 500 litres) of the cryogen is poured into the communicating vessel, the cryogen may overflow from the recycling container 1760 through the opening 1761 when the communicating vessel is full. The overflowing cryogen may flow to the inner vessel 1710 so that the primary coils are immersed in the cryogen. The cryogen in the inner vessel 1710 may further cool the primary coils, the secondary coils, and/or the coil carrier. Therefore, a temperature gradient of the superconducting coils may be greatly reduced to better maintain a superconducting state of the superconducting coils. In some embodiments, a volume of the inner vessel 1710 may be 2000-3000 L. For a conventional MR scanner, to keep the superconducting coils in a superconducting state, a liquid level of the cryogen in the inner vessel 1710 may need to be higher than 70% of a diameter of the secondary coils (e.g., the secondary coil 1731). According to the configurations of the present disclosure, 1500 litres of the cryogen may be needed to fill the inner vessel 1710. By using this cooling technique and cooling assembly as described in the present disclosure, a liquid level of the cryogen in the inner vessel 1710 may need to be only 30% of a liquid level of the cryogen filling the inner vessel 1710 by a conventional cooling technique and cooling assembly. In some embodiments, the consumption of the cryogen may only be 100-500 litres, saving a 60%-90% consumption of the cryogen.

Generally, each of the superconducting coils may be a multiple conductor turns. The each of the superconducting coils may be subject to a large Lorentz force, resulting in a large hoop stress and an axial stress when the multiple conductor turns work under a large current. A conductor turn of a superconducting coil may be moved under a large stress (e.g., the hoop stress and the axial stress), which may cause a quench of the superconductivity of the superconducting coil and even a damage of the superconducting coil. In order to suppress the movement of a conductor turn, a material such as epoxy resin may be used to adhere the multiple conductor turns of a superconducting coil together. However, the contraction rate of a heat exchanger made of a metal material may be larger than the contraction rate of a superconducting coil filled with a material such as epoxy resin. Therefore, at a low temperature, the heat exchanger may exert a clamping force to the superconducting coil in a circumferential direction. The clamping force may resist the hoop stress of the multiple conductor turns of the superconducting coil. Thus, the coil movement may be suppressed, further reducing the probability of a quenching of the superconductivity of the superconducting coil and improving the stability of the MRI system.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the plurality of heat exchangers may be integrated into one single heat exchanger. The single heat exchanger may encompass the superconducting coils.

Figure 18:
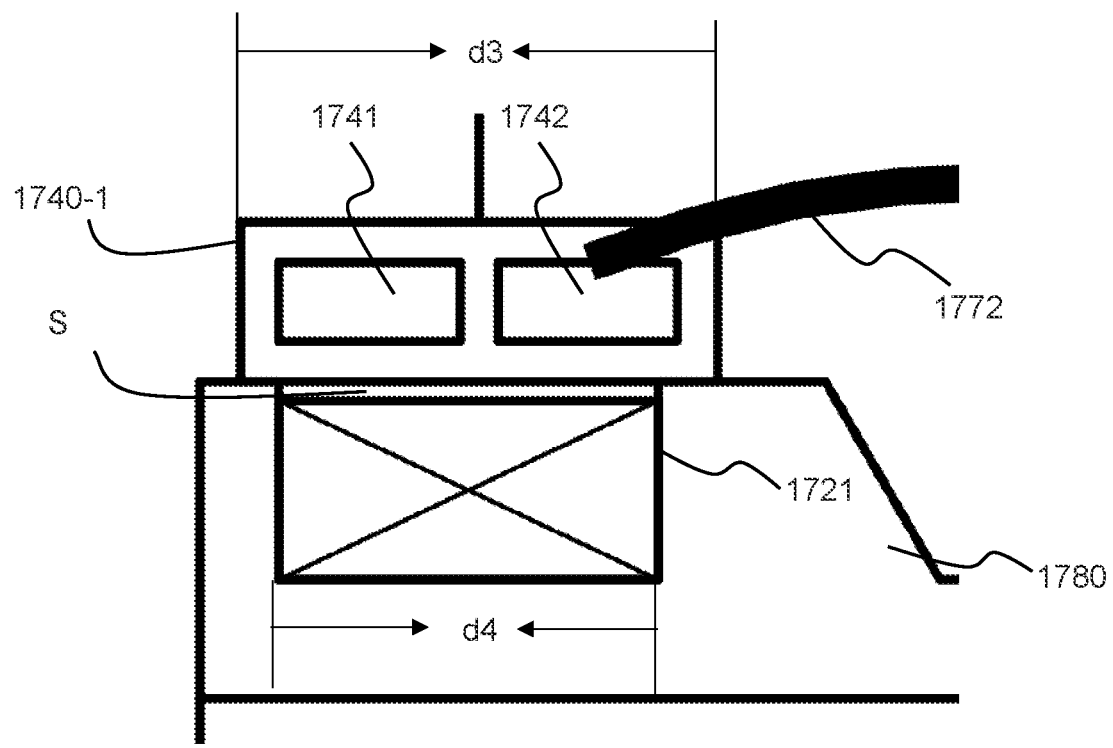
FIG. 18 is an enlarged view of region G shown in FIG. 17 illustrating an exemplary heat exchanger according to some embodiments of the present disclosure.

FIG. 18 is an enlarged view of region G shown in FIG. 17 illustrating an exemplary heat exchanger according to some embodiments of the present disclosure. As illustrated in FIG. 18, the primary coil 1721 may be located in a trunking of the primary coil carrier 1780. The heat exchanger 1740-1 may be mounted on an outer circumferential surface of the primary coil carrier 1780 using a connecting technique as described elsewhere in the present disclosure. For example, the heat exchanger 1740-1 may be mounted on the outer circumferential surface of the primary coil carrier 1780 using screws, rivets, etc. In some embodiments, a width $d_3$ of the heat exchanger 1740-1 in an axial direction may be larger than or equal to a width $d_4$ of the trunking in the axial direction. Further, the heat exchanger 1740-1 may be configured to seal the primary coil 1721 in the trunking.

In some embodiments, the heat exchanger 1740-1 and the primary coil carrier 1780 may have a clearance fit. Under the clearance fit, an inner diameter of the heat exchanger 1740-1 may be larger than an outer diameter of the primary coil carrier 1780. A space S may be formed between the heat exchanger 1740-1 and the primary coil 1721. The space S may be filled with a thermally conductive adhesive (e.g., a silicon rubber, a silicon grease, or the like, or any combination thereof). In some embodiments, the space S may also be filled with a curing agent such as epoxy resin to adhere the heat exchanger 1740-1 to the primary coil 1721. The heat exchanger 1740-1 may exchange heat with the primary coil 1721 through the primary coil carrier 1780 and/or the heat conduction material (e.g., thermally conductive adhesive) between the heat exchanger 1740-1 and the primary coil 1721.

In some embodiments, the heat exchanger 1740-1 and the primary coil carrier 1780 may have an interference fit. Under the interference fit, the inner diameter of the heat exchanger 1740-1 may be smaller than or equal to the outer diameter of the primary coil carrier 1780. The heat exchanger 1740-1 may contact the primary coil carrier 1780 and the primary coil 1721.

The contact between the heat exchanger 1740-1 and the primary coil 1721 may facilitate heat exchange between the heat exchanger 1740-1 with the primary coil carrier 1780 and the primary coil 1721. To increase thermal conductivity, the primary coil carrier 1780 and the secondary coil carrier 1790 (not shown in FIG. 18) may be made of a metal or an alloy thereof, such as copper or an aluminum alloy. When the heat exchanger 1740-1 is adhered to the primary coil 1721 by filling the space S with a material such as epoxy resin, or assembled on the primary coil 1721 by an interference fit, an adhesion force and/or a frication force in an axial direction may be produced. The adhesion force and/or the frication force in the axial direction may suppress the movement of the primary coil 1721.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the heat exchanger 1740-1 may include more than two compartments.

Figure 19:
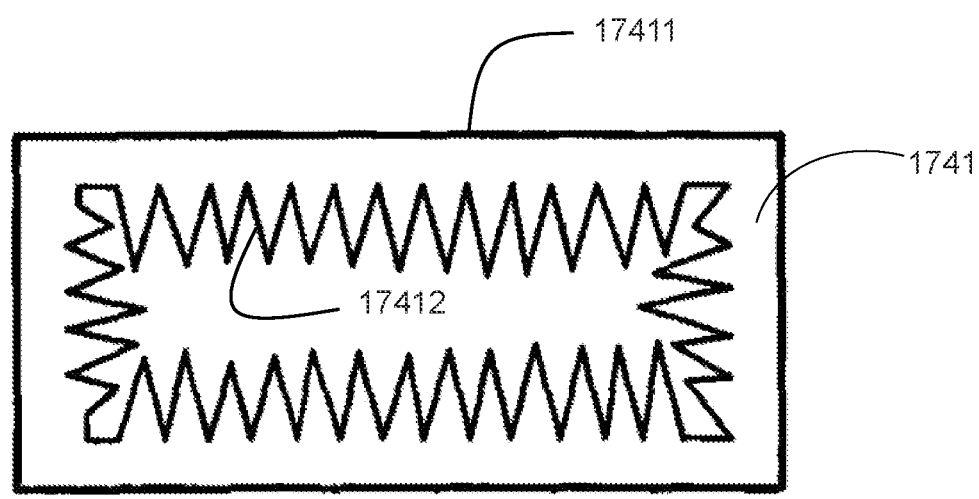
FIG. 19 is a sectional view of an exemplary compartment of a heat exchanger according to some embodiments of the present disclosure.

FIG. 19 is a sectional view of an exemplary compartment of a heat exchanger according to some embodiments of the present disclosure. A cross section of the compartment 1741 is illustrated in FIG. 19. In some embodiments, the cross section of an outer surface 17411 of the compartment 1741 may have a rectangle shape, an ellipse or a circle shape, or the like. In some embodiments, the cross section of an inner surface 17412 of the compartment 1741 may have a rectangle shape, an ellipse or a circle shape, a sawtooth shape, or the like. As used herein, the compartment 1741 may be a "heat pipe" with a sawtooth shape for the cross section of the inner surface 17412 to increase a contacting area between the cryogen and the heat exchanger 1740-1 (not shown in FIG. 19). This may further increase the heat exchange efficiency and thereby facilitate the maintenance of superconductivity of the primary coil 1721 (not shown in FIG. 19). In some embodiments, the cross section of the outer surface 17411 and the inner surface 17412 of the compartment 1741 may be of the same shape or different shapes. For example, the cross section of the outer surface 17411 and the inner surface 17412 of the compartment 1741 may both be of a rectangular shape. As another example, the cross section of the inner surface 17412 of the compartment 1741 may be of a rectangular shape, while the cross section of the outer surface 17411 of the compartment 1741 may be of a sawtooth shape. In some embodiments, the shapes of the cross sections of inner surfaces of the one or more compartments in a heat exchanger may be the same or different. For example, the cross section of the inner surface of the compartment 1741 and the compartment 1742 (not shown in FIG. 19) may both be of a rectangular shape. As another example, the cross section of the inner surface of the compartment 1741 may be of a rectangular shape, while the cross section of the inner surface of the compartment 1742 may be of a sawtooth shape.

Figure 20:
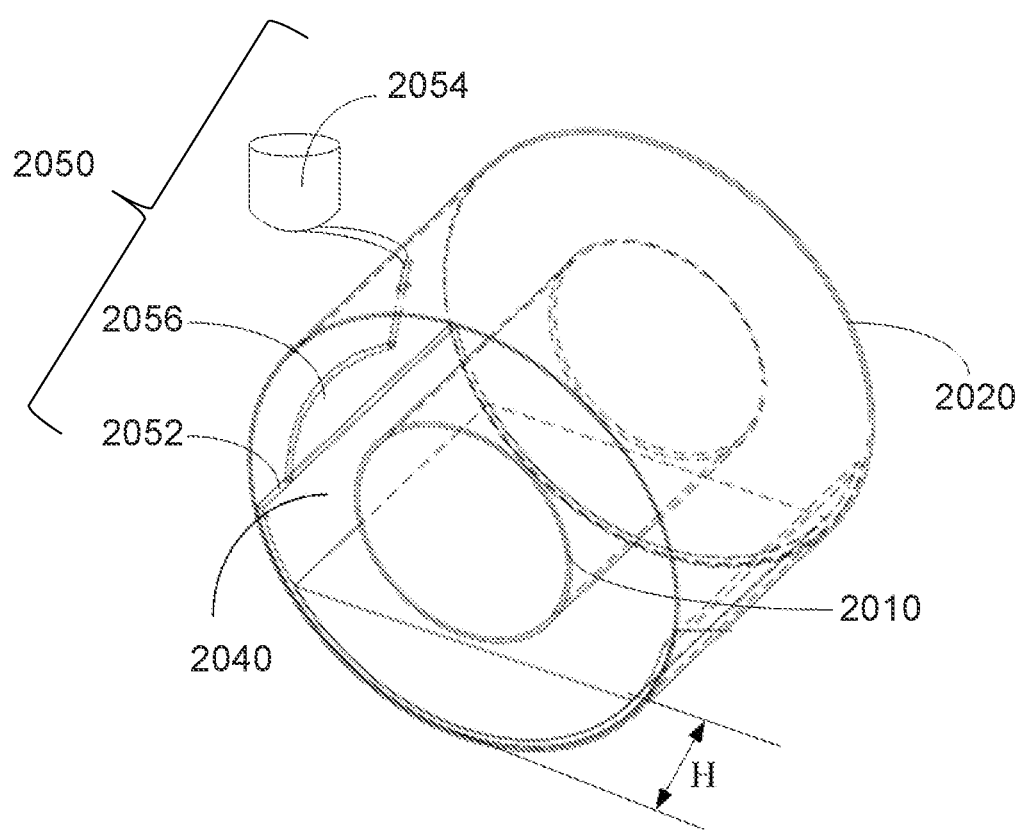
FIG. 20 is a schematic diagram of a portion of an exemplary cryostat according to some embodiments of the present disclosure.

FIG. 20 is a schematic diagram of a portion of an exemplary cryostat according to some embodiments of the present disclosure. In some embodiments, a cryostat may include an inner vessel 2000, an adjustment component 2050, and an outer vessel (not shown). More descriptions for the inner vessel and the outer vessel may be found elsewhere in the present disclosure (e.g., FIG. 5 and the descriptions thereof). The inner vessel 2000 as shown in FIG. 20 may include an inner cylinder 2010 and an outer cylinder 2020 encompassing the inner cylinder 2010. A space 2040 may be formed by the inner cylinder 2010 and outer cylinder 2020. The space 2040 may be configured to accommodate one or more superconducting coils and a cryogen (e.g., liquid nitrogen).

The adjustment component 2050 may include a deformable device 2052, a storage component 2054, and a first channel 2056. The deformable device 2052 may be configured to adjust a liquid level of the cryogen in the space 2040 of the inner vessel 2000 by changing a volume of the deformable device 2052. The volume of the deformable device 2052 may vary based on the amount of a volume-adjustment medium in the deformable device 2052. With a change of the volume of the deformable device 2052, a volume of a portion of the deformable device 2052 immersed in the cryogen may change, which may further cause the liquid level in the space 2040 to be changed. In some embodiments, the volume-adjustment medium in the deformable device 2052 may be liquid, such as liquid helium, gas, etc.

In some embodiments, the deformable device 2052 may include a bag. The material of the deformable device 2052 may include fibers, rubber, latex, metal foils, or the like, or a combination thereof. The fibers may include glass fibers, carbon fibers, polyester fibers, cotton fabric, linen fabric, etc. In some embodiments, the deformable device 2052 may be attached to the inner wall of the outer cylinder 2020 using a connecting technique. Exemplary connecting techniques may include a welding connection, a riveting connection, a locking connection, a pin connection, an adhering connection, a clamp connection, a threaded connection, a pinning connection etc.

The storage component 2054 may store the volume-adjustment medium. The storage component 2054 may be in fluid communication with the deformable device 2052 via the first channel 2056. For example, the volume-adjustment medium may flow from the storage component 2054 to the deformable device 2052 when the liquid level of the inner vessel 2000 is lower than a threshold. The storage component 2054 may be placed outside or inside the inner vessel 2000. For example, the storage component 2054 may be placed in the space 2040 above the liquid level of the cryogen. In some embodiments, the first channel 2056 may be a plastic pipe, a rubber pipe, a stainless steel pipe, etc.

In some embodiments, the adjustment component 2050 may further include a first valve (not shown in FIG. 20). The first valve may be mounted on the first channel 2056, the storage component 2054, or a connection between the first channel 2056 and the storage component 2054. The first valve may be configured to control the amount of the volume-adjustment medium flowing from the storage component 2054 to the deformable device 2052.

To maintain electrical properties of the superconducting coils (e.g., essentially zero electrical resistance), the entire superconducting coils or at least a portion (e.g., 70%) of the superconducting coils may be immersed in the cryogen to maintain the superconducting coils at a low working temperature (e.g., approximately 4.2 Kelvin). The liquid level H of the cryogen in the space 2040 of the inner vessel 2000 may be configured to be maintained within a range. The range of the liquid level H may include a minimum liquid level to maintain the electrical properties of the superconducting coils. For example, the minimum liquid level may be 5 centimeters. When the liquid level H of the inner vessel 2000 is lower than the minimum liquid level, the volume-adjustment medium stored in the storage component 2054 may flow into the deformable device 2052. The volume of the deformable device 2052 immersed in the cryogen may be increased. The liquid level of the cryogen in the space 2040 may be raised to or above the minimum liquid level.

Figure 21:
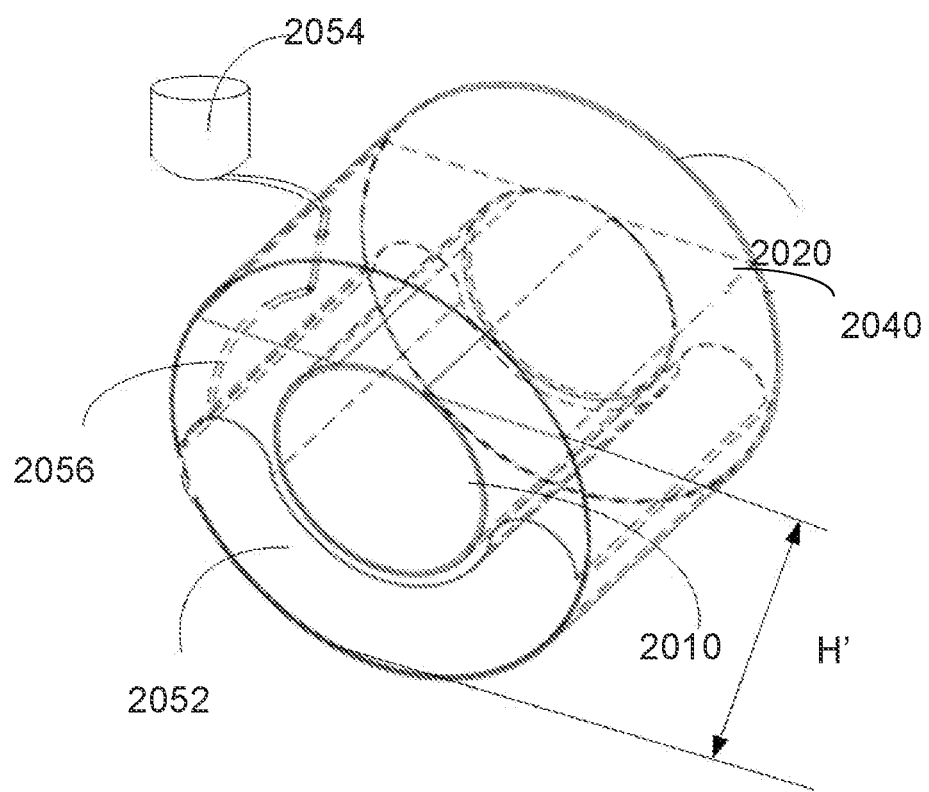
FIG. 21 is a schematic diagram of the cryostat shown in FIG. 20 with a raised liquid level according to some embodiments of the present disclosure.

FIG. 21 is a schematic diagram of the cryostat shown in FIG. 20 with a raised liquid level according to some embodiments of the present disclosure. As shown in FIG. 20, when the volume of the volume-adjustment medium inside the deformable device 2052 is insufficient to maintain a minimum liquid level, the cooling of the superconducting coils may be negatively affected, causing the electrical properties of the superconducting coils to deteriorate and even the failure of the MRI system 100. To keep the liquid level of the cryogen in the space 2040 to reach or above the minimum liquid level, the volume-adjustment medium may flow from the storage component 2054 into the deformable device 2052 via the first channel 2056. The volume of the deformable device 2052 may expand, and the volume of the deformable device 2052 immersed in the cryogen may increase, which may lead to the liquid level H as shown in FIG. 20 raising to the liquid level H' as shown in FIG. 21. The liquid level H' of the cryogen in space 2040 may raise to or above the minimum liquid level so that the superconducting coils may be cooled properly to maintain the superconducting state of the superconducting coils.

Figure 22:
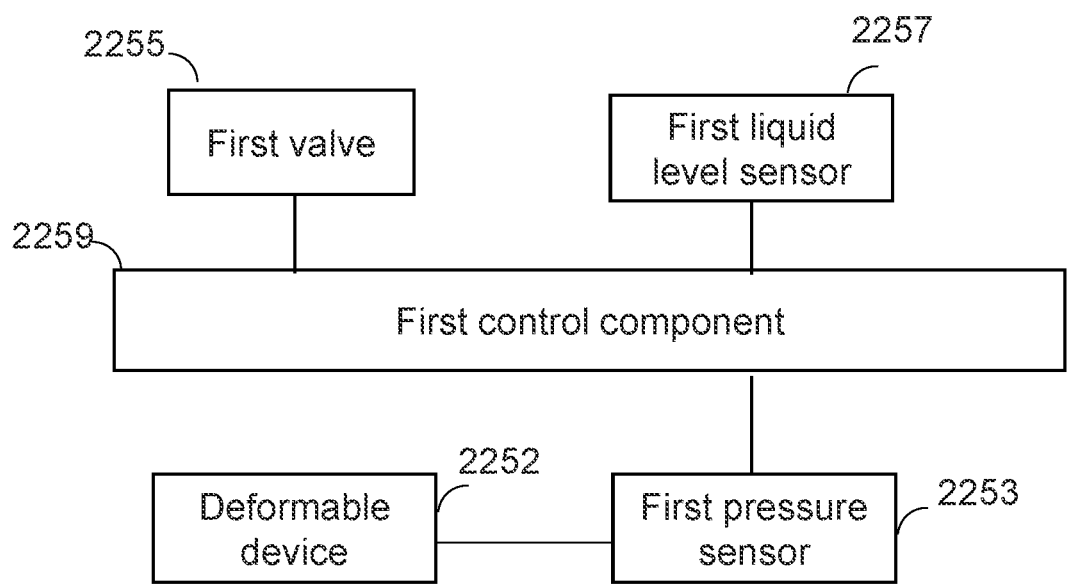
FIG. 22 is a block diagram of an exemplary adjustment component according to some embodiments of the present disclosure.

FIG. 22 is a block diagram of an exemplary adjustment component 2200 according to some embodiments of the present disclosure. As shown in FIG. 22, the adjustment component 2200 may include a deformable device 2252, a first pressure sensor 2253, a first valve 2255, a first liquid level sensor 2257, and a first control component 2259. In some embodiments, the adjustment component 2200 may further include a storage component and a first channel not shown in FIG. 22. The first channel may connect the storage component and the deformable device 2252. More descriptions for the deformable device 2252, the first valve 2255, the first channel, and the storage component may be found elsewhere in the present disclosure (e.g., FIG. 20 and the descriptions thereof).

The first pressure sensor 2253 may be connected to and/or communicate with the first control component 2259 via a wireless connection or a wired connection. For example, the first pressure sensor 2253 may be connected with the first control component 2259 via an electric connection. The first pressure sensor 2253 may be configured to detect pressure inside the deformable device 2252. Further, the first pressure sensor 2253 may be configured to send the detected pressure inside the deformable device 2252 to the first control component 2259, the storage device 130, etc.

The first valve 2255 may be connected to and/or communicate with the first control component 2259 via a wireless connection or a wired connection. For example, the first valve 2255 may be connected with the first control component 2259 via an electric connection. The first valve 2255 may be configured to allow the volume-adjustment medium to flow between the deformable device 2252 and the storage component. Further, the pressure in the deformable device 2252 may be adjusted by the first valve 2255 and a volume-adjustment medium (e.g., a gas, a liquid, etc.) stored in the storage component (e.g., the storage component 2054). In some embodiments, the first valve 2255 may be mounted on the storage component. In some embodiments, the first valve 2255 may be mounted on the deformable device 2252.

The first liquid level sensor 2257 may be connected to and/or communicate with the first control component 2259 via a wireless connection or a wired connection. For example, the first liquid level sensor 2257 may be connected with the first control component 2259 via an electric connection. The first liquid level sensor 2257 may be configured to detect a liquid level of the space (e.g., the space 2040) inside the inner vessel. Further, the first liquid level sensor 2257 may be configured to send the detected liquid level of the space to the first control component 2259, the storage device 130, etc. In some embodiments, the first liquid level sensor 2257 may be located in the space of the inner vessel (e.g., the inner vessel 2000) of a cryostat.

The first control component 2259 may connect to the first pressure sensor 2253, the first liquid level sensor 2257, and/or the first valve 2255. The first control component 2259 may be configured to control operations of at least one of the first pressure sensor 2253, the first liquid level sensor 2257, or the first valve 2255.

In some embodiments, the first control component 2259 may control the first pressure sensor 2253 to detect pressure inside the deformable device 2252. The first control component 2259 may further receive data (e.g., a pressure signal inside the deformable device 2252) from the first pressure sensor 2253. In some embodiments, the first control component 2259 may control the first liquid level sensor 2257 to detect a liquid level of the space (e.g., the space 2040) inside the inner vessel (e.g., the inner vessel 2000). The first control component 2259 may further receive data (e.g., a liquid level signal inside the space of inner vessel) from the first liquid level sensor 2257.

In some embodiments, the first control component 2259 may analyze the detected pressure inside the deformable device 2252 and/or the detected liquid level of the space (e.g., the space 2040) inside the inner vessel (e.g., the inner vessel 2000). For example, the first control component 2259 may determine the amount of the gas inside the deformable device 2252 based on the detected pressure inside the deformable device 2252. As another example, the first control component 2259 may determine the volume of the deformable device 2252 based on the amount of the gas inside the deformable device 2252.

In some embodiments, the first control component 2259 may control the first valve 2255 to adjust the liquid level. For example, the first control component 2259 may be configured to turn on or off the switch of the first valve 2255. As another example, the first control component 2259 may enlarge or decrease the opening of the first valve 2255. In some embodiments, the first control component 2259 may control the first valve 2255 based on the received data from the first pressure sensor 2253 and/or the first liquid level sensor 2257. For example, if the first control component 2259 determines that the detected pressure (or the amount of gas) inside the deformable device 2252 is lower than a threshold, the first control component 2259 may open the first valve 2255 to allow the gas as the volume-adjustment medium to flow into the deformable device, thereby increasing the pressure (or the amount of gas) inside the deformable device 2252. As another example, if the first control component 2259 determines that the detected liquid level of the inner vessel is lower than a minimum liquid level as described elsewhere in the present disclosure, the first control component 2259 may open the first valve 2255 to adjust the amount of the volume-adjustment medium in the deformable device 2252.

It should be noted that the above description of the adjustment component is provided for the purpose of illustration, and not intended to limit the scope of the present disclosure. For persons having ordinary skills in the art, modules may be combined in various ways, or connected with other modules as sub-systems. All such modifications are within the protection scope of the present disclosure. For example, the first liquid level sensor 2257 may be omitted.

Figure 23:
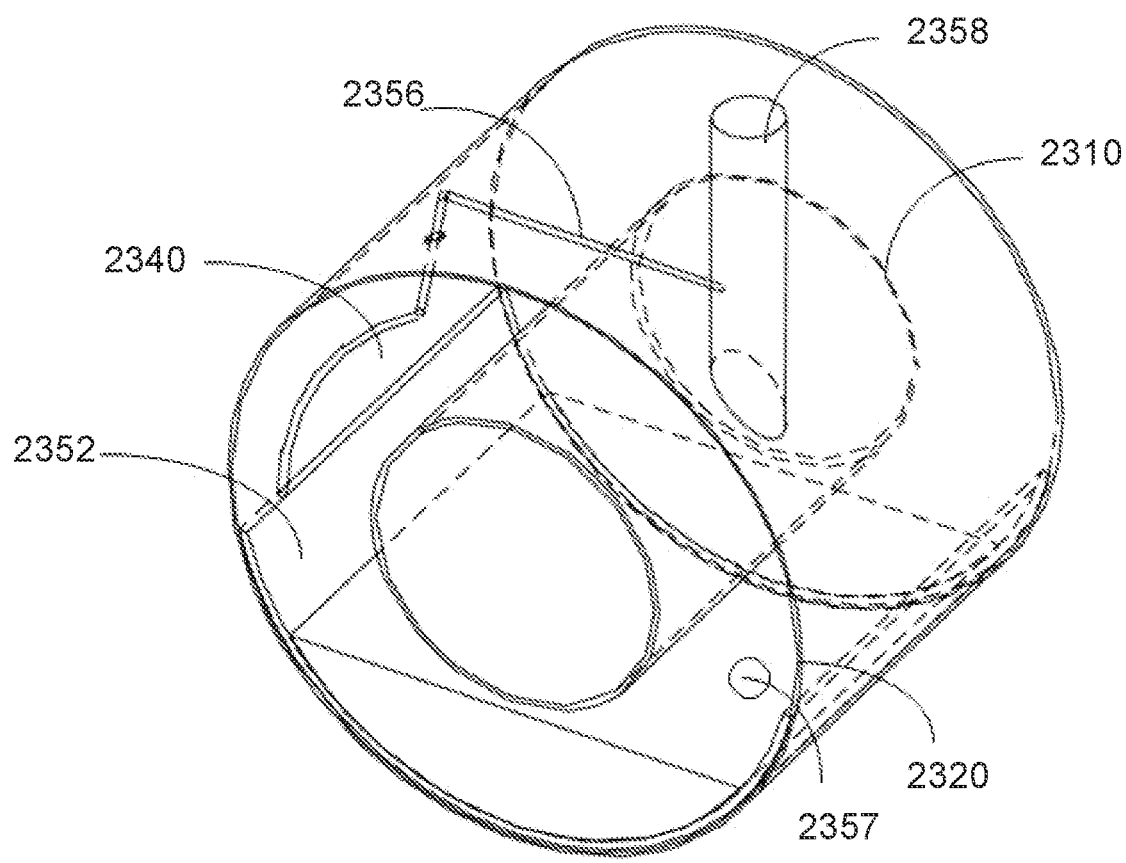
FIG. 23 is schematic diagram of a portion of an exemplary cryostat according to some embodiments of the present disclosure.

FIG. 23 is a schematic diagram of one portion of another exemplary cryostat according to some embodiments of the present disclosure. A cryostat may include an inner vessel 2300, an adjustment component, and an outer vessel (not shown). More descriptions for the inner vessel and the outer vessel may be found elsewhere in the present disclosure (e.g., FIG. 5 and the descriptions thereof). The inner vessel 2300 as shown in FIG. 23 may include an inner cylinder 2310 and an outer cylinder 2320 encompassing the inner cylinder 2310. A space 2340 may be formed by the inner cylinder 2310 and the outer cylinder 2320. The space 2340 may be configured to accommodate one or more superconducting coils and a cryogen (e.g., liquid nitrogen).

As shown in FIG. 23, the adjustment component may include a deformable device 2352, a second channel 2358, a third channel 2356, and a heating device 2357. The deformable device 2352 may be similar to or the same as the deformable device 2052 as described in connection with FIG. 20. For example, the deformable device 2352 may be a gasbag made of the same material as the deformable device 2052.

The second channel 2358 may be configured to discharge vapor of a cryogen in the space 2340 from the cryostat. In some embodiments, the second channel 2358 may be located in the space 2340 entirely. The outer cylinder 2320 of the inner vessel 2300 may be configured with a first opening. The second channel 2358 may discharge the vapor of the cryogen in the space 2340 from the cryostat via the first opening. In some embodiments, at least one portion of the second channel 2358 may be located outside the outer cylinder 2320. The vapor generated by the cryogen in the space 2340 may be discharged from the cryostat directly via the second channel 2358.

The third channel 2356 may be connected with the second channel 2358 and the deformable device 2352. The third channel 2356 may be configured to transfer the vapor of the cryogen in the space 2340 from the second channel 2358 to the deformable device 2352.

The heating component 2357 may be configured to heat the cryogen in the space 2340 to generate the vapor. The amount of the vapor generated by the cryogen may be controlled by controlling the power of the heating component 2357. In some embodiments, the heating device 2357 may be located in the space 2340. For example, the heating device 2357 may be mounted on the inner wall of the outer cylinder 2320. As another example, the heating device 2357 may be mounted on the bottom of the inner cylinder 2310.

In some embodiments, the adjustment component may further include a second valve (not shown in FIG. 23). In some embodiments, the second valve may be mounted on the second channel 2358, or the third channel 2356, or a connection between the second channel 2358 and the third channel 2356. The second valve may be configured to control the amount of the vapor of the cryogen discharged from the second channel 2358 to the third channel 2356. For example, when the liquid level of the cryogen in the space 2340 is lower than a minimum liquid level, the second valve may be opened and the vapor of the cryogen may be transported from the second channel 2358 to the deformable device 2352 to increase the volume of the deformable device 2352, which may raise the liquid level of the cryogen in the space 2340.

In some embodiments, the adjustment component may further include a storage component, a fourth channel and a third valve (not shown in FIG. 23). The storage component may be configured to collect the vapor of the cryogen from the second channel 2358. The fourth channel may be configured to transfer the vapor of the cryogen from the storage component to the deformable device 2352. The third valve may be configured to control the amount of the vapor of the cryogen from the storage component to the deformable device 2352. The third valve may be mounted on the fourth channel, the storage component, or a joint between the fourth channel and the storage component.

When the volume of the deformable device 2352 cannot provide the minimum liquid level, the second valve may be opened to allow the vapor of the cryogen to flow from the space 2340 to the deformable device 2352 to expand the volume of the deformable device 2352. If the transmitted vapor of the cryogen is insufficient to raise the liquid level to the minimum liquid level, the heating component 2357 may be activated to heat the cryogen to generate more vapor of the cryogen. As a result, more vapor of the cryogen may flow to the deformable device 2352 to raise the liquid level to or above the minimum liquid level.

It should be noted that the above description of the adjustment component is provided for the purpose of illustration, and not intended to limit the scope of the present disclosure. For persons having ordinary skills in the art, modules may be combined in various ways, or connected with other modules as sub-systems. All such modifications are within the protection scope of the present disclosure. For example, the third channel 2356 may be omitted. The second channel 2358 may be connected to the deformable device 2352 directly.

Figure 24:
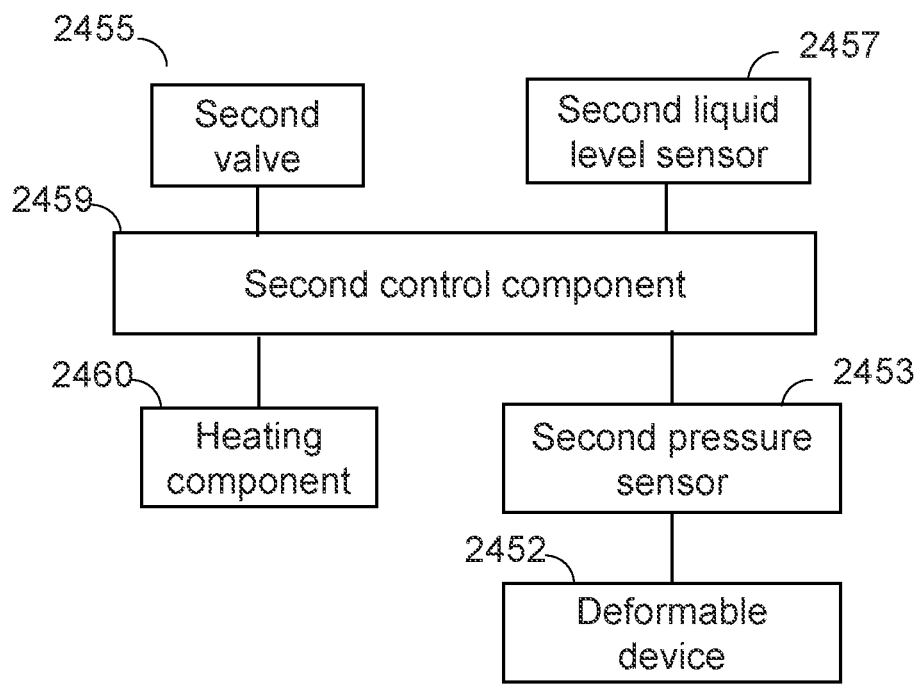
FIG. 24 is a block diagram of an exemplary adjustment component according to some embodiments of the present disclosure.

FIG. 24 is a block diagram of another exemplary adjustment component according to some embodiments of the present disclosure. As shown in FIG. 24, the adjustment component may include a deformable device 2452, a second pressure sensor 2453, a second valve 2455, a second liquid level sensor 2457, a second control component 2459, and a heating component 2460. In some embodiments, the adjustment component may further include a storage component, a second channel, and a third channel not shown in FIG. 24. More descriptions for the second channel, the third channel, and the storage component may be found elsewhere in the present disclosure (e.g., FIG. 23 and the descriptions thereof).

The second pressure sensor 2453 may be connected to and/or communicate with the second control component 2459 via a wireless connection or a wired connection. For example, the second pressure sensor 2453 may be connected with the second control component 2459 via an electric connection. The second pressure sensor 2453 may be configured to detect a second pressure inside the deformable device 2452. Further, the second pressure sensor 2453 may be configured to send the detected second pressure inside the deformable device 2452 to the second control component 2459, the storage device 130, etc.

The second valve 2455 may be connected to and/or communicate with the second control component 2459 via a wireless connection or a wired connection. For example, the second valve 2455 may be connected with the second control component 2459 via an electric connection. The second valve 2455 may be configured to allow the volume-adjustment medium to flow between the second channel and the third channel. In some embodiments, the second valve 2455 may be mounted on the second channel. In some embodiments, the second valve 2455 may be mounted on the third channel. More descriptions for the second valve 2455 may be found in elsewhere in the present disclosure (e.g., FIG. 23 and the descriptions thereof).

The second liquid level sensor 2457 may be connected to and/or communicate with the second control component 2459 via a wireless connection or a wired connection. For example, the second liquid level sensor 2457 may be connected with the second control component 2459 via an electric connection. The second liquid level sensor 2457 may be configured to detect a second liquid level of the space (e.g., the space 2340) inside the inner vessel. Further, the second liquid level sensor 2457 may be configured to send the detected second liquid level of the space to the second control component 2459, the storage device 130, etc.

The heating component 2460 may be connected to and/or communicate with the second control component 2459 via wireless or wire. For example, the heating component 2460 may be connected with the second control component 2459 via an electric connection. More descriptions for the heating component 2460 may be found in elsewhere in the present disclosure (e.g., FIG. 23 and the descriptions thereof).

The second control component 2459 may be configured to control operations of at least one of the second pressure sensor 2453, the second valve 2455, the second liquid level sensor 2457, and/or the heating component 2460. For example, the second control component 2459 may control the second valve 2455 based on the second liquid level inside the inner vessel and the second pressure inside the deformable device 2452. As another example, the second control component 2459 may control the power of the heating component 2460 and/or the switch state of the second valve 2455 to change a gas amount inside the deformable device 2452.

In some embodiments, the second control component 2459 may control the second pressure sensor 2453 to detect a second pressure inside the deformable device 2452. The second control component 2459 may further receive data (e.g., a pressure signal inside the deformable device 2452) from the second pressure sensor 2453. In some embodiments, the second control component 2459 may control the second liquid level sensor 2457 to detect a liquid level of the space (e.g., the space 2340) inside the inner vessel (e.g., the inner vessel 2300). The second control component 2459 may further receive data (e.g., a liquid level signal inside the space of inner vessel) from the second liquid level sensor 2457.

In some embodiments, the second control component 2459 may analyze the detected second pressure inside the deformable device 2452 and/or the detected second liquid level of the space (e.g., the space 2340) inside the inner vessel (e.g., the inner vessel 2300). For example, the second control component 2459 may determine the amount of the gas inside the deformable device 2452 based on the detected pressure inside the deformable device 2452. As another example, the second control component 2459 may determine the volume of the deformable device 2252 based on the amount of the gas inside the deformable device 2252.

In some embodiments, the second control component 2459 may control the second valve 2455. For example, the second control component 2459 may be configured to turn on or off the switch of the second valve 2455. As another example, the second control component 2459 may enlarge or decrease the opening of the second valve 2455. In some embodiments, the second control component 2459 may control the second valve 2455 based on the received data from the second pressure sensor 2453 and/or the second liquid level sensor 2457. For example, if the second control component 2459 determines that the gas amount inside the deformable device 2452 is less than a threshold, the second control component 2459 may open the second value 2455 to increase the amount of the gas inside the deformable device 2452. The second control component 2459 may also start the heating component 2460 to vapor the cryogen (e.g., liquid nitrogen) inside of the inner vessel. The vapored cryogen (e.g., liquid nitrogen) may enter the deformable device 2452 to increase the amount of the gas inside the deformable device 2452. As another example, if the second control component 2459 determines that the detected second liquid level of the inner vessel lowers than a minimum liquid level as described elsewhere in the present disclosure, the second control component 2459 may close the second valve 2455 and power off the heating component 2460 to adjust the amount of the gas inside the deformable device 2452.

It should be noted that the above description of the adjustment component is provided for the purpose of illustration, and not intended to limit the scope of the present disclosure. For persons having ordinary skills in the art, modules may be combined in various ways, or connected with other modules as sub-systems. For example, the second channel may be not necessary. All such modifications are within the protection scope of the present disclosure.

Figure 25:
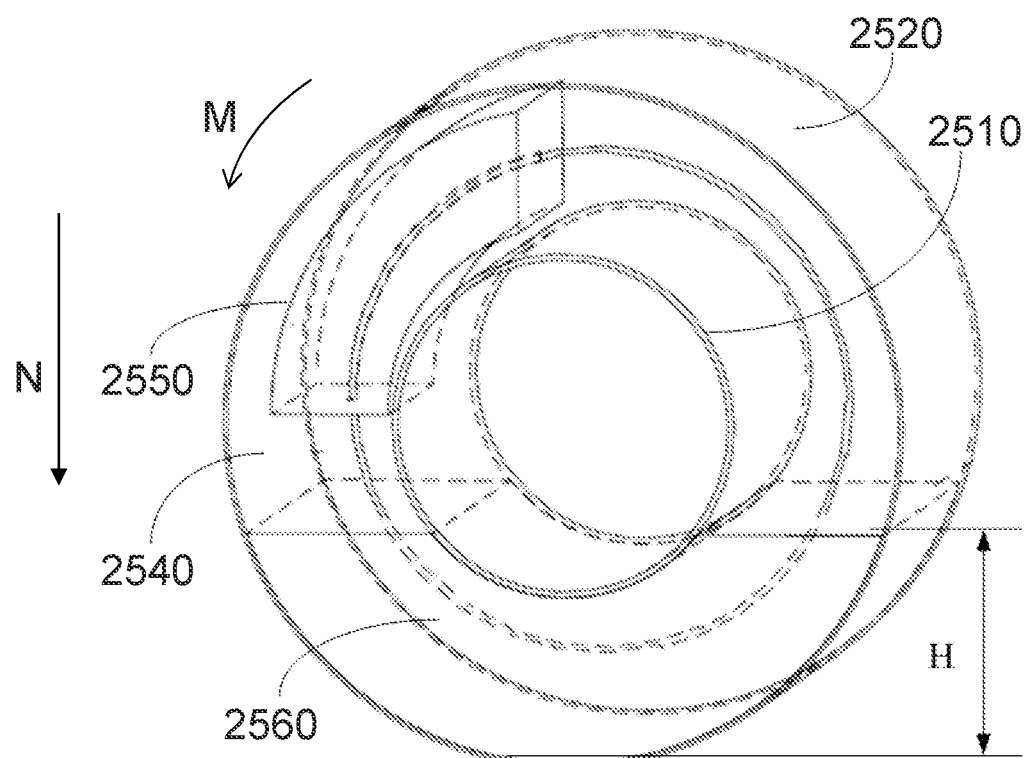
FIG. 25 is a schematic diagram of a portion of an exemplary cryostat according to some embodiments of the present disclosure.

FIG. 25 is a schematic diagram of a portion of an exemplary cryostat according to some embodiments of the present disclosure. As shown in FIG. 25, a cryostat may include an inner vessel 2500, an adjustment component 2550, a transmission component 2560, and an outer vessel (not shown). More descriptions for the inner vessel and the outer vessel may be found elsewhere in the present disclosure (e.g., FIG. 5 and the descriptions thereof). The inner vessel 2500 as shown in FIG. 25 may include an inner cylinder 2510 and an outer cylinder 2520 encompassing the inner cylinder 2510. A space 2540 may be formed by the inner cylinder 2510 and the outer cylinder 2520. The space 2540 may be configured to accommodate one or more superconducting coils and a cryogen (e.g., liquid nitrogen).

The adjustment component 2550 may be configured to adjust a liquid level of the cryogen in the space 2540 of the inner vessel 2500 by changing a volume of the adjustment component 2550 immersed in the cryogen. The greater the volume of the adjustment component 2550 immersed in the cryogen, the greater the liquid level of the cryogen in the space 2540 may be. The adjustment component 2550 may include a block. In some embodiments, the block may be solid or hollow. For example, the block may include a cavity. The cavity in the block may be filled with gas, e.g., helium. The block may include at least one material selected from, for example, a metal (e.g., aluminum), a plastic, a fiber, a rubber, etc.

Figure 26:
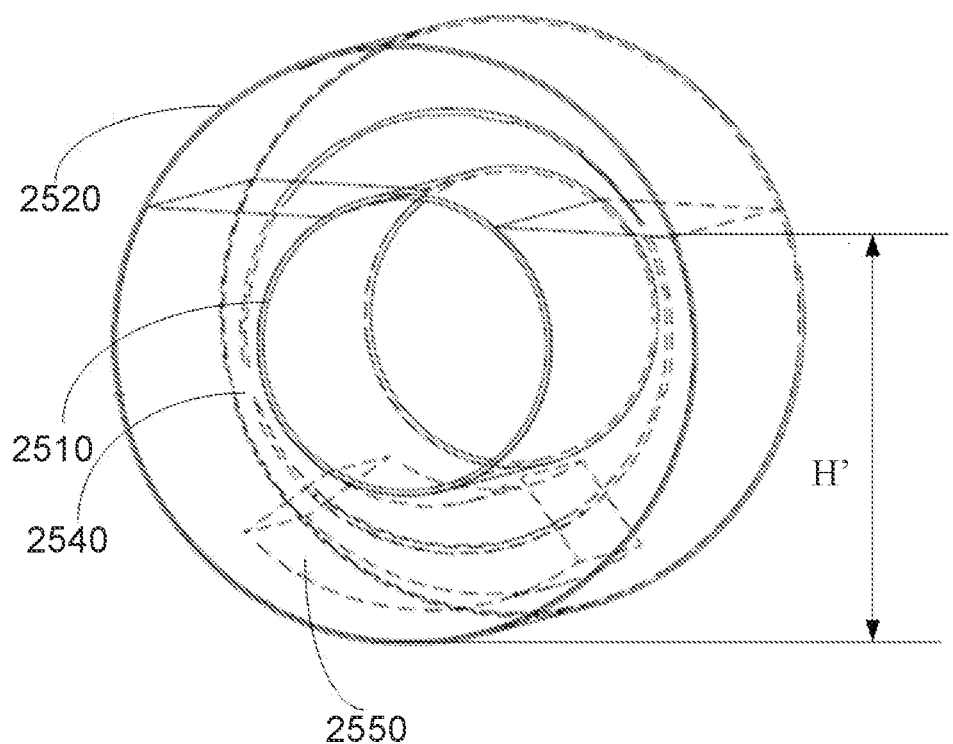
FIG. 26 is a schematic diagram illustrating an increased liquid level of cryogen in the inner vessel 2500 according to some embodiments of the present disclosure.

The adjustment component 2550 may be moveable in the space 2540 in a vertical direction denoted by arrow N or a circumferential direction of the inner vessel 2500 denoted by arrow M as shown in FIG. 25. When at least one portion of the adjustment component 2550 moves into or out from the cryogen (e.g., liquid nitrogen), the liquid level of the cryogen in the space 2540 may change. For example, when the adjustment component 2550 is located at the upper portion of the space 2540, the liquid level of the cryogen in the space 2540 may be H as shown in FIG. 25. After at least a portion of the adjustment component 2550 moves into the cryogen (e.g., liquid nitrogen) and immersed in the cryogen (e.g., liquid nitrogen) as shown in FIG. 26, the liquid level of the cryogen in the space 2540 may increase to H'. After the adjustment component 2550 moves out the cryogen (e.g., liquid nitrogen), the liquid level of the cryogen in the space 2540 may decrease.

The transmission component 2560 may be configured to move the adjustment component 2550. In some embodiments, the transmission component 2560 may include a guide rail. The guide rail may be mounted around the inner wall of the outer cylinder 2520 or the outer wall of the inner cylinder 2510 using a connecting technique as described elsewhere in the present disclosure. The adjustment component 2550 may be mounted on the guide rail and slide along the guide rail via a bearing.

In some embodiments, the cryostat may further include a third control component and a third liquid level sensor. The third liquid level sensor may be connected to and/or communicate with the third control component via a wireless connection or a wired connection. For example, the third liquid level sensor may be connected with the third control component via an electric connection. The third liquid level sensor may be configured to detect the liquid level (i.e., a third liquid level) of the cryogen in the space 2540. Further, the third liquid level sensor may be configured to send the detected third liquid level to the third control component, the storage device 130, etc. The third control component may be configured to control operations of at least one of the third liquid level sensor, and/or the transmission component 2560. For example, the third control component may receive the third liquid level from the third liquid level sensor. The third control component may control the transmission component 2560 to move the adjustment component 2550 to change the third liquid level of the cryogen (e.g., liquid nitrogen) in the space 2540.

It should be noted that the above description of the adjustment component is provided for the purpose of illustration, and not intended to limit the scope of the present disclosure. For persons having ordinary skills in the art, modules may be combined in various ways, or connected with other modules as sub-systems. All such modifications are within the protection scope of the present disclosure. In some embodiments, the transmission component 2560 may include a pulley and a cable. The adjustment component 2550 may be connected with an end of the cable passing through the pulley. The adjustment component 2550 may be moved by pulling another end of the cable. In some embodiments, the transmission component 2560 may include an electromagnetic drive. For example, an electromagnetic switch may be mounted on the upper end of the outer cylinder 2520. When the electromagnetic switch is turned on, the electromagnetic switch may generate a magnetic force. The adjustment component 2550 may be moved toward the electromagnetic switch under the magnetic force. When the electromagnetic switch is turned off, the magnetic force may disappear. The adjustment component 2550 may be moved into cryogen (e.g., liquid nitrogen) under the gravity. In some embodiments, the transmission component 2560 may be omitted. The adjustment component 2550 may be moved along the inner wall of the outer cylinder 2520 or the outer wall of the inner cylinder 2510 via grooves or bulges located on the inner wall of the outer cylinder 2520 or the outer wall of the inner cylinder 2510.

FIG. 26 is a schematic diagram illustrating an increased liquid level of cryogen in the inner vessel 2500 according to some embodiments of the present disclosure. As shown in FIG. 26, after the adjustment component 2550 moves into the cryogen (e.g., liquid nitrogen) and is immersed in the cryogen (e.g., liquid nitrogen), the liquid level of the cryogen in the space 2540 increases to H'.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a specific feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the specific features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected with the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claimed subject matter may lie in less than all features of a single foregoing disclosed embodiment.

What is claimed is:

1. A cryostat comprising:
   an inner vessel configured to accommodate one or more superconducting coils;
   an outer vessel encompassing the inner vessel; and
   a thermal shield configured between the outer vessel and the inner vessel; and
   a cooling assembly configured to cool the one or more superconducting coils, the cooling assembly including:
   at least one heat exchanger configured to absorb heat generated by the one or more superconducting coils using a cryogen;
   one or more tubes in fluid communication with the at least one heat exchanger for transferring the cryogen;
   a refrigeration device configured to cool the cryogen after the cryogen cools the one or more superconducting coils; and
   a recycling container configured to accommodate the cryogen, the recycling container being in fluid communication with the one or more tubes and the refrigeration device;
   wherein
   the recycling container has an opening located underneath the refrigeration device,
   at least a portion of the refrigeration device is located within the recycling container via the opening,
   the at least one heat exchanger, the one or more tubes, the refrigeration device, and the recycling container constitute a communicating vessel and the communicating vessel is open as a result of the opening, and
   a certain volume of the cryogen overflows from the communicating vessel through the opening to the inner vessel when the communicating vessel is full.

2. The cryostat of claim 1, wherein the at least one heat exchanger includes one or more compartments configured to accommodate at least one of the cryogen or the cooled cryogen, and the one or more compartments are in fluid communication with the recycling container via the one or more tubes.

3. The cryostat of claim 1, wherein the at least one heat exchanger, the one or more tubes, and the recycling container are located in the inner vessel.

4. The cryostat of claim 1, wherein a top end of each of the one or more tubes in a vertical direction is lower than or at a same level as an inner bottom of the recycling container.

5. The cryostat of claim 1, wherein the refrigeration device includes a cooling head and a cooling pole, at least a portion of the refrigeration device being positioned in the inner vessel.

6. The cryostat of claim 1, wherein each of the one or more superconducting coils is configured with one of at least one heat exchanger or at least two of the one or more superconducting coils share one of at least one heat exchanger.

7. The cryostat of claim 1, wherein one of the at least one heat exchanger is distributed on one of an inner surface and an outer surface of one of the one or more superconducting coils, and a shape of one of the at least one heat exchanger fits a shape of the one of the inner surface and the outer surface of one of the one or more superconducting coils on a circumferential direction of the cryostat.

8. The cryostat of claim 1, wherein one of the at least one heat exchanger includes a plurality of partial rings distributed on a surface of at least one of the one or more superconducting coils along a circumferential direction of the cryostat to form a ring.

9. The cryostat of claim 1, wherein the at least one heat exchanger includes a plurality of partial rings distributed on a surface of one of the one or more superconducting coils along an axial direction of the cryostat to form a straight-line structure or a curved structure.

10. The cryostat of claim 1, wherein one of the at least one heat exchanger includes an integral ring being sheathed and assembled on a surface of at least one of the one or more superconducting coils.

11. The cryostat of claim 2, wherein at least one of the one or more compartments is a heat pipe with a sawtooth shape for a cross section of an inner surface of one of the at least one heat exchanger.

12. The cryostat of claim 2, wherein the one or more compartments connected with each other in parallel or in series and the connected one or more compartments are further connected with the recycling container through one of the one or more tubes.

13. The cryostat of claim 1, wherein the one or more superconducting coils includes one or more the primary coils, one of the one or more the primary coils is located in a trunking of a primary coil carrier, and one of the at least one heat exchanger is mounted on an outer circumferential surface of the primary coil carrier.

14. The cryostat of claim 13, wherein a width of the one of the at least one heat exchanger in an axial direction is larger than or equal to a width of the trunking in the axial direction.

15. The cryostat of claim 13, wherein an adhesion force or a friction force in an axial direction is provided by the one of the at least one heat exchanger on the one of the one or more the primary coils to suppress the movement of the one of the one or more the primary coils.

16. The cryostat of claim 15, wherein the one of the at least one heat exchanger and the primary coil carrier have a clearance fit or an interference fit.

17. A superconducting magnet assembly, comprising:
   one or more superconducting coils;
   at least one coil carrier configured to support the one or more superconducting coils;
   a cryostat, wherein at least one of the one or more superconducting coils is disposed inside the cryostat, the cryostat including:
   an inner vessel configured to accommodate one or more superconducting coils;
   an outer vessel encompassing the inner vessel;
   a thermal shield configured between the outer vessel and the inner vessel; and
   a cooling assembly configured to cool the one or more superconducting coils, the cooling assembly including:
   at least one heat exchanger configured to absorb heat generated by the one or more superconducting coils using a cryogen;
   one or more tubes in fluid communication with the at least one heat exchanger for transferring the cryogen;
   a refrigeration device configured to cool the cryogen after the cryogen cools the one or more superconducting coils; and a recycling container configured to accommodate the cryogen, the recycling container being in fluid communication with the one or more tubes and the refrigeration device;

wherein the recycling container has an opening located underneath the refrigeration device, at least a portion of the refrigeration device is located within the recycling container via the opening, the at least one heat exchanger, the one or more tubes, the refrigeration device, and the recycling container constitute a communicating vessel and the communicating vessel is open as a result of the opening, and a certain volume of the cryogen overflows from the communicating vessel through the opening to the inner vessel when the communicating vessel is full.

18. The superconducting magnet assembly of claim 17, wherein the at least one heat exchanger includes one or more compartments configured to accommodate at least one of the cryogen or the cooled cryogen, and the one or more compartments are in fluid communication with the recycling container via the one or more tubes.

19. The superconducting magnet assembly of claim 17, wherein the at least one heat exchanger, the one or more tubes, and the recycling container are located in the inner vessel.

20. The superconducting magnet assembly of claim 17, wherein a top end of each of the one or more tubes in a vertical direction is lower than or at a same level as an inner bottom of the recycling container.

* * * * *